US012588319B2

(12) United States Patent
Cha et al.

(10) Patent No.: US 12,588,319 B2
(45) Date of Patent: Mar. 24, 2026

(54) LIGHT-EMITTING DEVICE, MANUFACTURING METHOD THEREFOR, AND DISPLAY APPARATUS

(71) Applicant: Samsung Display Co., LTD., Yongin-si (KR)

(72) Inventors: Hyung Rae Cha, Seoul (KR); Dong Uk Kim, Hwaseong-si (KR); Se Young Kim, Gwangju (KR)

(73) Assignee: Samsung Display Co., Ltd., Yongin-si (KR)

( * ) Notice: Subject to any disclaimer, the term of this patent is extended or adjusted under 35 U.S.C. 154(b) by 643 days.

(21) Appl. No.: 18/008,389

(22) PCT Filed: Aug. 11, 2020

(86) PCT No.: PCT/KR2020/010620
§ 371 (c)(1),
(2) Date: Dec. 5, 2022

(87) PCT Pub. No.: WO2021/246572
PCT Pub. Date: Dec. 9, 2021

(65) Prior Publication Data
US 2023/0352621 A1 Nov. 2, 2023

(30) Foreign Application Priority Data
Jun. 5, 2020 (KR) ........................ 10-2020-0068445

(51) Int. Cl.
*H10H 20/81* (2025.01)
*H10H 20/01* (2025.01)
(Continued)

(52) U.S. Cl.
CPC .. *H10H 20/8162* (2025.01); *H10H 20/01335* (2025.01); *H10H 20/821* (2025.01); *H10H 20/8252* (2025.01); *H10H 20/831* (2025.01)

(58) Field of Classification Search
CPC ......... H10H 20/8162; H10H 20/01335; H10H 20/821; H10H 20/8252; H10H 20/831;
(Continued)

(56) References Cited

U.S. PATENT DOCUMENTS 8,809,875 B2 8/2014 Bibl et al.
9,773,761 B2 9/2017 Do
(Continued)

FOREIGN PATENT DOCUMENTS

CN 105453284 A 3/2016
CN 107210350 A 9/2017
(Continued)

OTHER PUBLICATIONS

Chinese Office Action dated Apr. 1, 2025, issued in corresponding Chinese Patent Application No. 202080101758.8, 8 pages.
(Continued)

*Primary Examiner* — S M Sohel Imtiaz
(74) *Attorney, Agent, or Firm* — Womble Bond Dickinson (US) LLP

(57) ABSTRACT

A light-emitting device includes: a light-emitting device core including a first semiconductor layer, a second semiconductor layer on the first semiconductor layer, and an active layer between the first semiconductor layer and the second semiconductor layer; an electrode layer on the second semiconductor layer of the light-emitting device core, and an insulating film around a side surface of the light-emitting device core, wherein a side surface of the electrode layer protrudes outward from a side surface of the second semiconductor layer.

24 Claims, 22 Drawing Sheets

(51) Int. Cl.

| | | |
|---|---|---|
| *H10H 20/816* | (2025.01) |
| *H10H 20/821* | (2025.01) |
| *H10H 20/825* | (2025.01) |
| *H10H 20/831* | (2025.01) |

(58) Field of Classification Search
CPC .... H10H 20/032; H10H 20/84; H10H 20/819; H10H 29/142; H10D 86/00; H10D 86/40; H01L 25/0756
See application file for complete search history.

(56) References Cited

U.S. PATENT DOCUMENTS

| | | | | |
|---|---|---|---|---|
| 10,338,712 | B2 * | 7/2019 | Bok | ................... G02F 1/13338 |
| 10,910,512 | B2 | 2/2021 | Sung | |
| 11,145,798 | B2 | 10/2021 | Yoon et al. | |
| 11,500,484 | B2 | 11/2022 | Bok et al. | |
| 11,728,457 | B2 | 8/2023 | Sung | |
| 11,861,092 | B2 | 1/2024 | Bok et al. | |
| 2017/0317228 | A1 * | 11/2017 | Sung | ...................... H10H 20/84 |
| 2018/0012876 | A1 * | 1/2018 | Kim | .................. H10H 20/8252 |
| 2018/0062057 | A1 * | 3/2018 | Sweegers | ........... H10H 20/8583 |
| 2021/0151624 | A1 * | 5/2021 | Sung | ................... H10H 20/813 |
| 2022/0238753 | A1 * | 7/2022 | Gruart | ................. H10H 20/824 |
| 2023/0025769 | A1 * | 1/2023 | Kim | ...................... H01L 25/167 |
| 2024/0103653 | A1 | 3/2024 | Bok et al. | |

FOREIGN PATENT DOCUMENTS

| | | | | | | |
|---|---|---|---|---|---|---|
| CN | 110783362 | A | | 2/2020 | | |
| KR | 20130067441 | A | | 6/2013 | | |
| KR | 10-1436123 | B1 | | 11/2014 | | |
| KR | 10-2016-0059576 | A | | 5/2016 | | |
| KR | 20160059576 | A | * | 5/2016 | .......... | H01L 25/075 |
| KR | 10-2016-0110587 | A | | 9/2016 | | |
| KR | 10-2017-0024905 | A | | 3/2017 | | |
| KR | 20170109718 | A | | 10/2017 | | |
| KR | 10-2018-0007025 | A | | 1/2018 | | |
| KR | 20180007025 | A | * | 1/2018 | ............ | H05B 33/20 |
| KR | 10-2019-0105537 | A | | 9/2019 | | |
| KR | 10-2019-0137742 | A | | 12/2019 | | |
| KR | 10-2020-0013190 | A | | 2/2020 | | |
| KR | 10-2020-0023327 | A | | 3/2020 | | |

OTHER PUBLICATIONS

International Search Report for corresponding Application No. PCT/KR2020/010620 dated Mar. 4, 2021, 5pp.

Written Opinion of the International Search Authority for corresponding Application No. PCT/KR2020/010620 dated Mar. 4, 2021, 2pp.

Chinese Office Action dated Sep. 17, 2025 regarding Chinese Patent Application No. 202080101758.8 (7 pages).

* cited by examiner

FIG. 4

14 : GE,CSE
16 : SD1,SD2,DTL
18 : VL1,VL2,CDP
TR : ACT,GE,SD1,SD2

LIGHT-EMITTING DEVICE, MANUFACTURING METHOD THEREFOR, AND DISPLAY APPARATUS

CROSS REFERENCE TO RELATED APPLICATION(S)

This application is a U.S. National Phase Patent Application of International Patent Application Number PCT/KR2020/010620, filed on Aug. 11, 2020, which claims priority to and the benefit of Korean Patent Application Number 10-2020-0068445, filed on Jun. 5, 2020, the entire contents of all of which are incorporated by reference herein.

BACKGROUND

1. Field

Aspects of embodiments of the present disclosure relate to a light-emitting device, a manufacturing method therefor, and a display apparatus.

2. Description of the Related Art

The importance of display devices has steadily increased with the development of multimedia technology. In response thereto, various types of display devices such as an organic light emitting diode (OLED) display, a liquid crystal display (LCD), and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects and features of embodiments of the present disclosure provide a light-emitting device of which reliability is improved by disposing an insulating film so as to surround a plurality of semiconductor layers and an active layer so that the plurality of semiconductor layers and the active layer are not exposed.

Aspects and features of embodiments of the present disclosure also provide a light-emitting device of which a weight is decreased by forming a first semiconductor layer so that a maximum diameter of the first semiconductor layer is smaller than or equal to a minimum diameter of an active layer.

Aspects and features of embodiments of the present disclosure also provide a manufacturing method for the light-emitting device.

Aspects and features of embodiments of the present disclosure also provide a display apparatus including the light-emitting device.

It should be noted that aspects and features of embodiments of the present disclosure are not limited thereto and other aspects and features of embodiments which are not mentioned herein, will be apparent to those of ordinary skill in the art from the following description.

According to one or more embodiments of the present disclosure, a light-emitting device includes a light-emitting device core including a first semiconductor layer, a second semiconductor layer on the first semiconductor layer, and an active layer between the first semiconductor layer and the second semiconductor layer, an electrode layer on the second semiconductor layer of the light-emitting device core, and an insulating film around a side surface of the light-emitting device core, wherein a side surface of the electrode layer protrudes outwardly from a side surface of the second semiconductor layer.

One surface of the electrode layer toward the second semiconductor layer may include a first region overlapping the second semiconductor layer and a second region that does not overlap the second semiconductor layer, and the insulating film may be on the second region.

The insulating film may expose at least a portion of the side surface of the electrode layer.

The insulating film may not be on the side surface of the electrode layer.

A diameter of an outer surface of the insulating film on the one surface of the electrode layer may be same as a diameter of the one surface of the electrode layer.

The second region may be around the first region.

An area of the first region may be greater than an area of the second region.

An outer surface of the insulating film in a region adjacent to the second region may be aligned with the side surface of the electrode layer.

A minimum diameter of the second semiconductor layer may be greater than a maximum diameter of the first semiconductor layer.

A diameter of the second semiconductor layer may decrease from the electrode layer toward the active layer.

A diameter of the active layer may decrease from the second semiconductor layer toward the first semiconductor layer.

The maximum diameter of the first semiconductor layer may be smaller or equal to a minimum diameter of the active layer.

A first thickness of the insulating film on the second region may be different from a second thickness of the insulating film on the side surface of the electrode layer.

The first thickness may be greater than the second thickness.

The insulating film may have a thickness in a range of 20 nm to 100 nm, and a protrusion length of the side surface of the electrode layer protruding from the second semiconductor layer in a thickness direction of the insulating film may be in a range of about 20 nm to about 120 nm.

According to one or more embodiments of the present disclosure, a manufacturing method for a light-emitting device includes forming a light-emitting device core and an electrode layer on a substrate, the electrode layer being on the light-emitting device core, and forming an insulating film around a side surface of the light-emitting device core, wherein the forming of the light-emitting device core and the electrode layer includes forming the electrode layer having a side surface outwardly from a side surface of the light-emitting device core.

The light-emitting device core may include a first semiconductor layer on the substrate, a second semiconductor layer between the first semiconductor layer and the electrode layer, and an active layer between the first semiconductor layer and the second semiconductor layer, wherein one surface of the electrode layer adjacent the second semiconductor layer may include a first region overlapping the second semiconductor layer and a second region that does not overlap the second semiconductor layer, and the insulating film may be on the second region.

The insulating film may expose at least a portion of the side surface of the electrode layer.

The forming of the insulating film may include forming an insulating coating covering outer surfaces of the light-emitting device core and the electrode layer, and exposing an other surface of the electrode layer opposite to the one surface of the electrode layer and at least a portion of the side surface of the electrode layer by removing a portion of the insulating coating.

A minimum diameter of the second semiconductor layer may be greater than a maximum diameter of the first semiconductor layer.

A diameter of the second semiconductor layer may decrease from the electrode layer toward the active layer, and a diameter of the active layer may decrease from the second semiconductor layer toward the first semiconductor layer.

According to one or more embodiments of the present disclosure, a display apparatus includes a substrate, a first electrode on the substrate, a second electrode on the substrate and spaced from the first electrode, and a light-emitting device between the first electrode and the second electrode and electrically connected to the first electrode and the second electrode, wherein the light-emitting device includes a light-emitting device core including a first semiconductor layer, a second semiconductor layer on the first semiconductor layer, and an active layer between the first semiconductor layer and the second semiconductor layer, an electrode layer on the second semiconductor layer of the light-emitting device core, and an insulating film around a side surface of the light-emitting device core, and a side surface of the electrode layer protrudes outwardly from a side surface of the second semiconductor layer.

One surface of the electrode layer toward the second semiconductor layer may have a first region overlapping the second semiconductor layer and a second region that does not overlap the second semiconductor layer, and the insulating film may be on the second region.

The insulating film may expose at least a portion of the side surface of the electrode layer.

The display apparatus may further include a first contact electrode on the first electrode and one end of the light-emitting device, and a second contact electrode on the second electrode and the other end of the light-emitting device, wherein the first contact electrode and the second contact electrode are electrically insulated from each other.

The first contact electrode may be on an other surface of the electrode layer opposite to the one surface of the electrode layer and a portion of the side surface of the electrode layer.

The second region may include a third region that does not overlap the insulating film, and the first contact electrode is further on the third region.

The details of other embodiments are included in the detailed description and the accompanying drawings.

With a light-emitting device according to one or more embodiments, a side surface of an electrode layer is formed to protrude outwardly from a side surface of a second semiconductor layer, and thus, the light-emitting device may have an under-cut shape in which the electrode layer includes a tip portion protruding from the second semiconductor layer. Accordingly, due to the under-cut shape, in a process of forming an insulating film, an insulating coating below the tip portion of the electrode layer may be protected by the electrode layer and thus, may not be removed. Accordingly, the insulating film around the light-emitting device core may be formed to completely surround a side surface of the light-emitting device core without exposing the side surface of the light-emitting device core. Reliability of a display apparatus may be improved by preventing damage to the light-emitting device that may occur due to exposure of a partial region of the side surface of the light-emitting device core.

In addition, in the light-emitting device according to one or more embodiments, an active layer may have a truncated cone shape in which a diameter of a lower surface thereof is smaller than a diameter of an upper surface thereof. Accordingly, a diameter of a first semiconductor layer of the light-emitting device according to one or more embodiments may be smaller than a diameter of a first semiconductor layer of a light-emitting device including an active layer having the same volume and having a cylindrical shape. Accordingly, the total volume and/or weight of the first semiconductor layer occupying most of the region of the light-emitting device in an extension direction may be decreased. Accordingly, due to the decrease in the weight of the first semiconductor layer, the total weight of the light-emitting device is decreased, such that a dispersion holding time of the light-emitting devices dispersed in ink may be increased in an inkjet printing process using the ink in which the light-emitting devices are dispersed during manufacturing processes of the display apparatus.

The effects according to one or more embodiments are not limited by the contents exemplified above, and more various effects are included in this disclosure.

BRIEF DESCRIPTION OF THE DRAWINGS

FIGS. 4 to 10 are cross-sectional views illustrating manufacturing processes of the light-emitting device according to one or more embodiments;

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
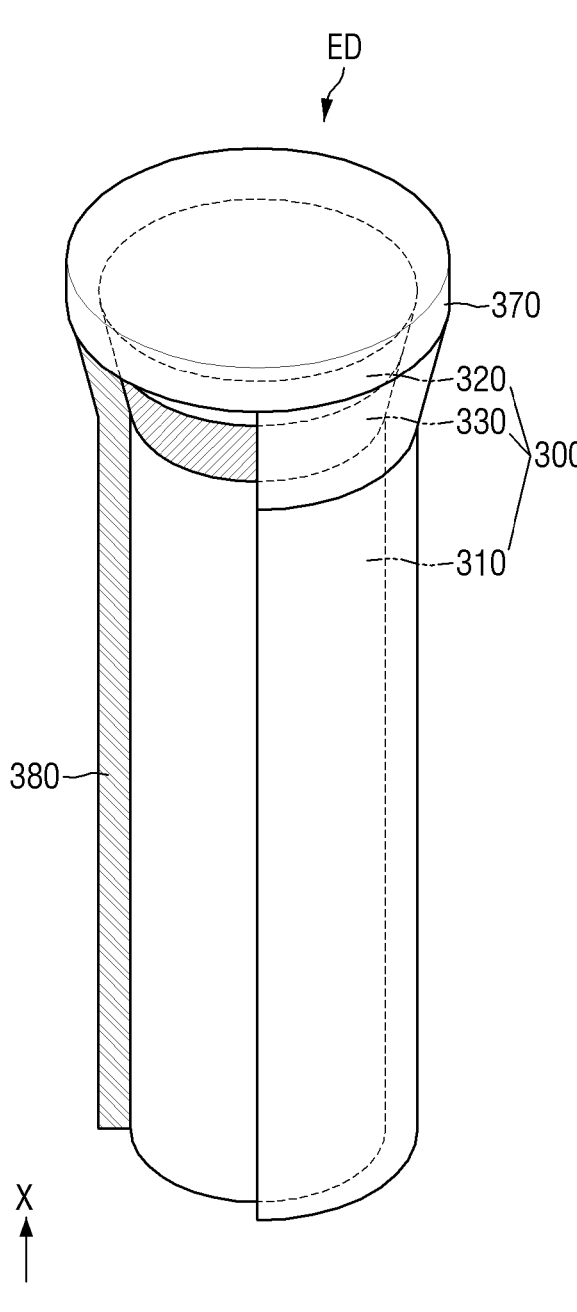
FIG. 1 is a schematic perspective cutaway view of a light-emitting device according to one or more embodiments.
Figure 2:
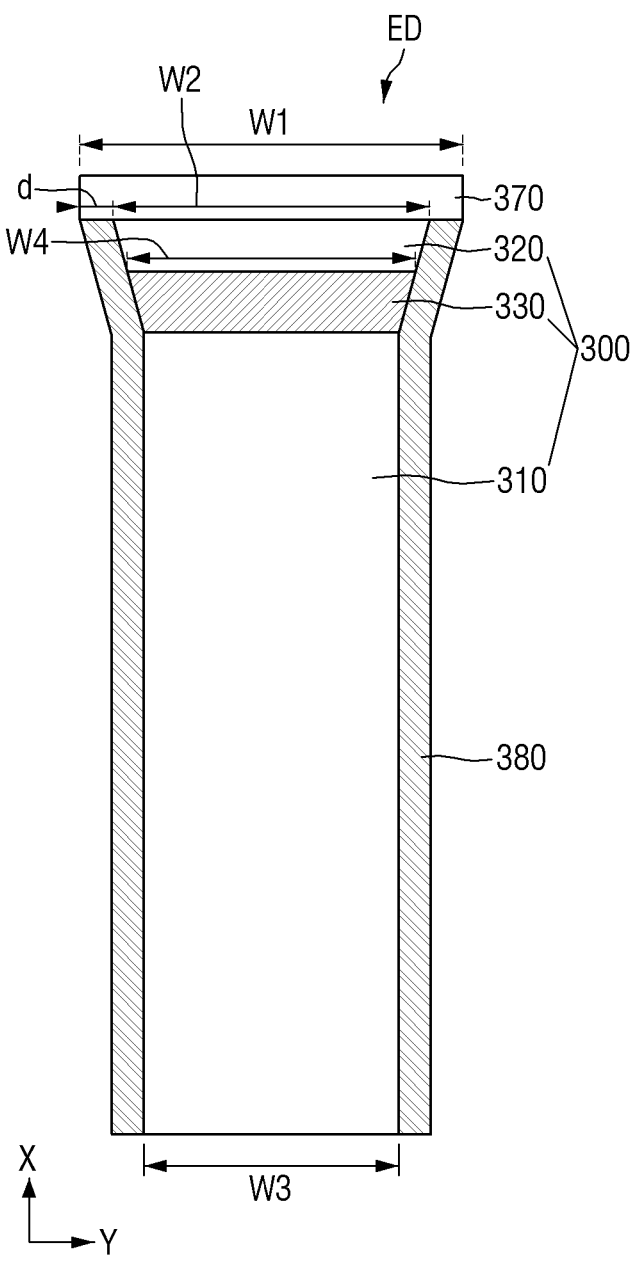
FIG. 2 is a cross-sectional view of the light-emitting device according to one or more embodiments.

FIG. 1 is a schematic perspective cutaway view of a light-emitting device according to one or more embodiments. FIG. 2 is a cross-sectional view of the light-emitting device according to one or more embodiments.

A light-emitting device ED may be a light emitting diode. Specifically, the light-emitting device ED may be an inorganic light emitting diode having a size of a micro-meter or nano-meter unit and made of an inorganic material. The inorganic light emitting diodes may be aligned between two electrodes in which polarities are formed when an electric field is formed in a specific direction between the two electrodes facing (e.g., opposing) each other. The light-emitting devices ED may be aligned between the two electrodes by the electric field formed between the two electrodes.

Referring to FIGS. 1 and 2, the light-emitting device ED according to one or more embodiments may have a shape in which it extends in the one direction (e.g., the X-axis direction). For example, the light-emitting device ED may have a pillar shape or a rod shape. However, the disclosure is not limited thereto, and the light-emitting device ED may also have a polygonal prismatic shape such as a rectangular parallelepiped shape or a hexagonal prismatic shape in which it extends in one direction (e.g., an X-axis direction).

The light-emitting device ED may include a light-emitting device core 300, an electrode layer 370 disposed on the light-emitting device core 300, and an insulating film 380 around (e.g., surrounding) a side surface of the light-emitting device core 300.

The light-emitting device core 300 may have a shape in which it extends along the one direction (e.g., the X-axis direction), which is an extension direction of the light-emitting device ED.

The light-emitting device core 300 may include a first semiconductor layer 310, a second semiconductor layer 320, and an active layer 330. The light-emitting device core 300 may have a structure in which respective layers are stacked along the one direction (e.g., the X-axis direction).

Hereinafter, in embodiments describing the light-emitting device ED, unless otherwise stated, the term "upper portion" refers to one side in the one direction (e.g., the X-axis direction) and refers to a side of the light-emitting device core 300 on which the electrode layer 370 is disposed, and the term "upper surface" refers to a surface toward the one side in the one direction (e.g., the X-axis direction). In addition, the term "lower portion" refers to the other side in the one direction (e.g., the X-axis direction) opposite to one side in the one direction (e.g., the X-axis direction), and the term "lower surface" refers to a surface toward the other side in the one direction (e.g., the X-axis direction).

The first semiconductor layer 310 may include one surface toward the electrode layer 370, the other surface, and a side surface. The other surface of the first semiconductor layer 310 may be opposite to one surface of the first semiconductor layer 310. In the drawings, one surface of the first semiconductor layer 310 may also be referred to as an upper surface, and the other surface of the first semiconductor layer 310 may also be referred to as a lower surface.

The first semiconductor layer 310 may have a shape in which it extends along the one direction (e.g., the X-axis direction), In one or more embodiments, the first semiconductor layer 310 may have a pillar shape or a rod shape. A diameter of the upper surface of the first semiconductor layer 310 may be the same as a diameter of the lower surface of the first semiconductor layer 310. The first semiconductor layer 310 may have an overall uniform diameter W3 along the one direction (e.g., the X-axis direction). The side surface of the first semiconductor layer 310 extending in the one direction (e.g., the X-axis direction) may be flat in cross-section. However, the present disclosure is not limited thereto, and the first semiconductor layer 310 may have a diameter varying along the one direction (e.g., the X-axis direction). In one or more embodiments, the diameter of the first semiconductor layer 310 may increase or decrease along the one direction (e.g., the X-axis direction). The first semiconductor layer 310 may have a diameter smaller than or equal to a minimum diameter of a second semiconductor layer 320 and an active layer 330 to be described later.

The first semiconductor layer 310 may occupy most of the region of the light-emitting device core 300 in the one direction (e.g., the X-axis direction). A length of the first semiconductor layer 310 may be in the range of 1.5 μm to 5 μm, but is not limited thereto.

The first semiconductor layer 310 may be an n-type semiconductor. As an example, when the light-emitting device ED emits light of a blue wavelength band, the first semiconductor layer 310 may include a semiconductor material having a chemical formula of $Al_xGayIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The first semiconductor layer 310 may be doped with an n-type dopant, which may be Si, Ge, Sn, or the like, as an example. In one or more embodiments, the first semiconductor layer 310 may be made of n-GaN doped with n-type Si.

The second semiconductor layer 320 may be disposed between the first semiconductor layer 310 and the electrode layer 370. The second semiconductor layer 320 may be disposed to be spaced from the first semiconductor layer 310 in the extension direction (e.g., the X-axis direction) of the light-emitting device ED.

The second semiconductor layer 320 may include one surface toward the electrode layer 370, the other surface, and a side surface. The other surface of the second semiconductor layer 320 may be opposite to the one surface of the second semiconductor layer 320. In the drawings, one surface of the second semiconductor layer 320 may also be referred to as an upper surface, and the other surface of the second semiconductor layer 320 may also be referred to as a lower surface.

A diameter of the upper surface of the second semiconductor layer 320 may be different from a diameter of the lower surface of the second semiconductor layer 320. A diameter W2 of the upper surface of the second semiconductor layer 320 may be greater than a diameter W4 of the lower surface of the second semiconductor layer 320, and the side surface of the second semiconductor layer 320 may have an inclined shape. The side surface of the second semiconductor layer 320 may be inclined while forming an acute angle with respect to the upper surface of the second semiconductor layer 320. A diameter of the second semiconductor layer 320 may decrease from the electrode layer 370 toward the first semiconductor layer 310. That is, the second semiconductor layer 320 may have a tapered angle, and may have a truncated cone shape in which the diameter of the upper surface thereof is greater than the diameter of the lower surface thereof.

A length of the second semiconductor layer 320 may be smaller than the length of the first semiconductor layer 310 in the X-axis direction. The length of the second semiconductor layer 320 may be in the range of 0.05 μm to 0.10 μm, but is not limited thereto.

The second semiconductor layer 320 may be a p-type semiconductor, and as an example, when the light-emitting device ED emits light of a blue or green wavelength band, the second semiconductor layer 320 may include a semiconductor material having a chemical formula of $Al_xGa_yIn_{1-x-y}N$ ($0\leq x\leq1$, $0\leq y\leq1$, and $0\leq x+y\leq1$). For example, the semiconductor material may be one or more of AlGaInN, GaN, AlGaN, InGaN, AlN, and InN doped with a p-type dopant. The second semiconductor layer 320 may be doped with a p-type dopant, which may be Mg, Zn, Ca, Se, Ba, or the like, as an example. In one or more embodiments, the second semiconductor layer 320 may be made of p-GaN doped with p-type Mg.

In one or more embodiments, it has been illustrated in the drawings that each of the first semiconductor layer 310 and the second semiconductor layer 320 is configured as one layer, but the present disclosure is not limited thereto. According to one or more embodiments, each of the first semiconductor layer 310 and the second semiconductor layer 320 may further include a larger number of layers, for example, a clad layer or a tensile strain barrier reducing (TSBR) layer, according to a material of an active layer 330 to be described later.

The active layer 330 may be disposed between the first semiconductor layer 310 and the second semiconductor layer 320. The active layer 330 may be interposed between the first semiconductor layer 310 and the second semiconductor layer 320.

The active layer 330 may include one surface toward the second semiconductor layer 320, the other surface, and a side surface. The other surface of the active layer 330 may be opposite to one surface of the active layer 330. In the drawings, one surface of the active layer 330 may also be referred to as an upper surface, and the other surface of the active layer 330 may also be referred to as a lower surface.

The upper surface of the active layer 330 may be positioned at the same plane as the lower surface of the second semiconductor layer 320. The upper surface of the active layer 330 may be in contact with the lower surface of the second semiconductor layer 320. A diameter W4 of the upper surface of the active layer 330 may be the same as the diameter W4 of the lower surface of the second semiconductor layer 320, but is not limited thereto. However, the present disclosure is not limited thereto, and other semiconductor layers may be further disposed between the active layer 330 and the first semiconductor layer 310.

The lower surface of the active layer 330 may be positioned at the same plane as the upper surface of the first semiconductor layer 310. The lower surface of the active layer 330 may be in contact with the upper surface of the first semiconductor layer 310. A diameter W3 of the lower surface of the active layer 330 may be the same as the diameter W3 of the upper surface of the first semiconductor layer 310, but is not limited thereto. However, the present disclosure is not limited thereto, and other semiconductor layers may be further disposed between the active layer 330 and the second semiconductor layer 320.

The diameter W4 of the upper surface of the active layer 330 may be different from the diameter W3 of the lower surface of the active layer 330. The diameter W4 of the upper surface of the active layer 330 may be greater than the diameter W3 of the lower surface of the active layer 330, and the side surface of the active layer 330 may have an inclined shape. The side surface of the active layer 330 may be inclined while forming an acute angle with respect to the upper surface of the active layer 330. A diameter of the active layer 330 may decrease from the electrode layer 370 toward the first semiconductor layer 310. That is, the active layer 330 may have a tapered angle, and may have a truncated cone shape in which the diameter of the upper surface thereof is greater than the diameter of the lower surface thereof.

A length of the active layer 330 may be smaller than the length of the first semiconductor layer 310 in the X-axis direction. The length of the active layer 330 may be in the range of 0.05 μm to 0.10 μm, but is not limited thereto.

The active layer 330 may include a material having a single or multiple quantum well structure. When the active layer 330 includes the material having the multiple quantum well structure, the active layer 36 may have a structure in which a plurality of quantum layers and well layers are alternately stacked. The active layer 330 may emit light by a combination of electron-hole pairs according to electrical signals applied through the first semiconductor layer 310 and the second semiconductor layer 320. As an example, when the active layer 330 emits light of a blue wavelength band, the active layer 330 may include a material such as AlGaN or AlGaInN. In particular, when the active layer 330 has the multiple quantum well structure, that is, the structure in which the quantum layers and the well layers are alternately stacked, the quantum layers may include a material such as AlGaN or AlGaInN, and the well layers may include a material such as GaN or AlInN. In one or more embodiments, the active layer 330 may include AlGaInN as a material of the quantum layers and AlInN as a material of the well layers to emit the blue light having the central wavelength band of 450 nm to 495 nm, as described above.

However, the disclosure is not limited thereto, and the active layer 330 may have a structure in which semiconductor materials having large band gap energy and semiconductor materials having small band gap energy are alternately stacked, and may include other Group Ill to Group V semiconductor materials according to a wavelength band of emitted light. The light emitted by the active layer 330 is not limited to the light of the blue wavelength band, and in some case, the active layer 330 may emit light of red and green wavelength bands.

Meanwhile, the light emitted from the active layer 330 may be emitted not only to both end surfaces of the light-emitting device ED in the extension direction (e.g., the X-axis direction), but also to both side surfaces of the light-emitting device ED. That is, a direction of the light emitted from the active layer 330 to the outside of the light-emitting device ED is not limited to the one direction (e.g., the X-axis direction).

The first semiconductor layer 310, the active layer 330, and the second semiconductor layer 320 included in the light-emitting device core 300 may be sequentially disposed or stacked along the one direction (e.g., the X-axis direction), which is the extension direction of the light-emitting device ED.

One end of the light-emitting device core 300 may be the upper surface of the second semiconductor layer 320, and the other end of the light-emitting device core 300 may be the lower surface of the first semiconductor layer 310. A minimum diameter of the second semiconductor layer 320 may be greater than a maximum diameter (or a diameter) of the first semiconductor layer 310. Accordingly, a cross-sectional shape of the light-emitting device core 300 may be a shape in which a region in which the first semiconductor layer 310 is disposed has a diameter that is substantially uniform along the one direction (e.g., the X-axis direction) and a region in which the active layer 330 and the second semiconductor layer 320 are disposed has a diameter that increases along the one direction (e.g., the X-axis direction). The side surface of the first semiconductor layer 310, the side surface of the active layer 330, and the side surface of the second semiconductor layer 320 that constitute the side surface of the light-emitting device core 300 may not protrude from each other, and may be aligned substantially in parallel with each other.

The electrode layer 370 may be disposed on the light-emitting device core 300. The electrode layer 370 may be disposed on an upper portion of the light-emitting device core 300. The electrode layer 370 may be disposed on one surface (or the upper surface) of the second semiconductor layer 320 of the light-emitting device core 300. In one or more embodiments, the electrode layer 370 may be directly disposed on the upper surface of the second semiconductor layer 320. However, the present disclosure is not limited thereto, and another semiconductor layer or electrode layer may be further disposed between the electrode layer 370 and the second semiconductor layer 320.

A side surface of the electrode layer 370 may protrude from the side surface of the light-emitting device core 300. That is, a diameter W1 of the electrode layer 370 may be greater than a diameter of the light-emitting device core 300 disposed below the electrode layer 370. Accordingly, the electrode layer 370 may overlap the light-emitting device core 300 in the one direction (e.g., the X-axis direction), and may completely cover the light-emitting device core 300 on the upper portion of the light-emitting device core 300. A detailed description of a relative arrangement between and diameters of the electrode layer 370, the light-emitting device core 300, and an insulating film 380 will be described later.

The electrode layer 370 may be an ohmic contact electrode. However, the present disclosure is not limited thereto, and the electrode layer 370 may also be a Schottky contact electrode. The electrode layer 370 may decrease resistance between the light-emitting device ED and electrodes 21 and 22 (see FIG. 19) or contact electrodes 41 and 42 (see FIG. 19) when the light-emitting device ED is electrically connected to the electrodes 21 and 22 and the contact electrodes 41 and 42 in a display apparatus 10 (see FIG. 17) to be described later.

The light-emitting device ED may include at least one electrode layer 370. It has been illustrated in the drawings that the light-emitting device ED includes one electrode layer 370, but the present disclosure is not limited thereto. In one or more embodiments, the light-emitting device ED may include a larger number of electrode layers 370.

The electrode layer 370 may include a metal having conductivity. The electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 370 may include a semiconductor material doped with an n-type or p-type dopant. The electrode layer 370 may include the same material or include different materials, but is not limited thereto.

The insulating film 380 may be disposed to be around (e.g., to surround) the light-emitting device core 300. The insulating film 380 may be formed to be around (e.g., to surround) side surfaces (e.g., outer peripheral or circumferential surfaces) of respective members of the light-emitting device core 300 to serve to protect the respective members of the light-emitting device core 300, for example, the first semiconductor layer 310, the second semiconductor layer 320, and the active layer 330.

In one or more embodiments, the insulating film 380 may be disposed to completely surround the side surfaces (e.g., the outer peripheral or circumferential surfaces) of the first semiconductor layer 310, the second semiconductor layer 320, and the active layer 330 of the light-emitting device core 300. The insulating film 380 may be formed to extend in the one direction (e.g., the X-axis direction) to cover the side surface (e.g., the outer peripheral or circumferential surface) of the first semiconductor layer 310 to the side surface (e.g., the outer peripheral or circumferential surface) of the active layer 330.

A length of the insulating film 380 in the one direction (e.g., the X-axis direction) may be the same as a length of the light-emitting device core 300 in the one direction (e.g., the X-axis direction). That is, the insulating film 380 is disposed to completely surround the side surface (e.g., the outer peripheral or circumferential surface) of the light-emitting device core 300, but may not be disposed on the side surface (e.g., the outer peripheral or circumferential surface) of the electrode layer 370. This will be described later in detail with reference to other drawings.

The insulating film 380 may have a substantially uniform thickness d along the one direction (e.g., the X-axis direction). The thickness of the insulating film 380 may be in the range of 10 nm to 1.0 μm, but is not limited thereto. In one or more embodiments, the thickness of the insulating film 380 may be in the range of about 20 nm to 100 nm.

The insulating film 380 may include materials having insulating properties, such as silicon oxide ($SiO_x$), silicon nitride ($SiN_x$), silicon oxynitride ($SiO_xN_y$), aluminum nitride (AlN), and aluminum oxide ($AlO_x$). The insulating film 380 may have a single film structure including the above-described materials or a multilayer structure in which films including the above-described materials are stacked.

Figure 17:
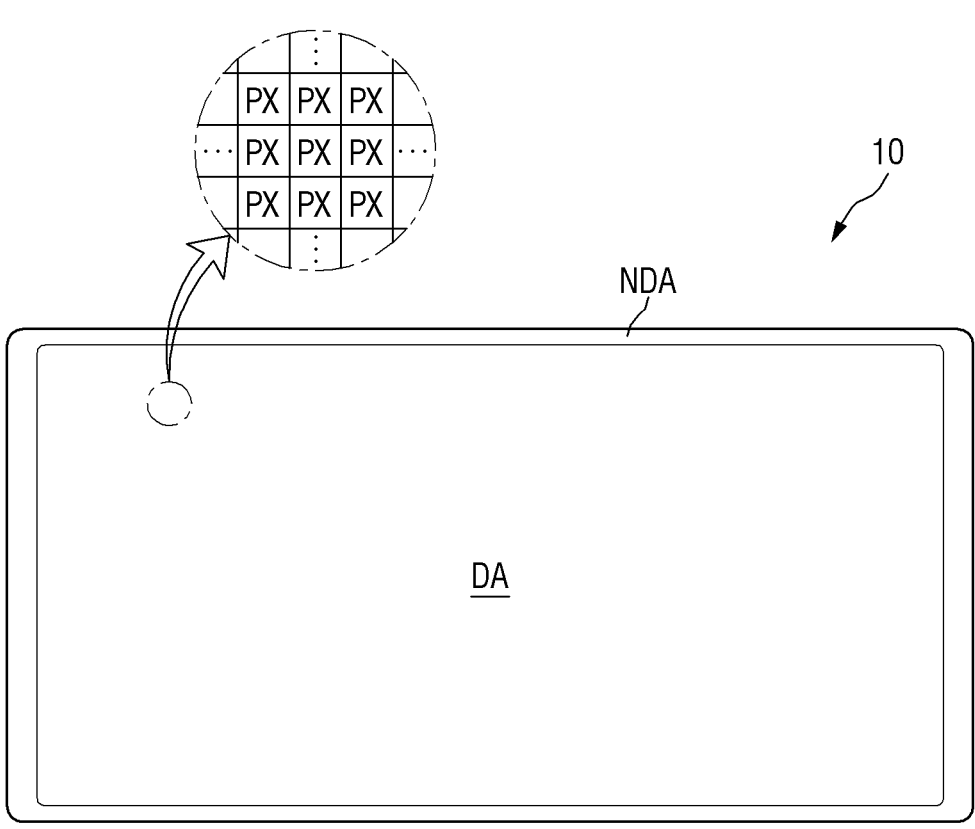
FIG. 17 is a plan view of a display apparatus according to one or more embodiments.
Figure 17:
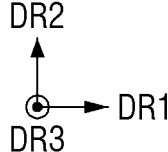

The insulating film 380 is formed to completely cover the side surface (e.g., the outer peripheral or circumferential surface) of the first semiconductor layer 310 to the side surface (e.g., the outer peripheral or circumferential surface) of the active layer 330, and may thus prevent the light-emitting device core 300 from being damaged in an etching process for forming a plurality of insulating layers from among manufacturing processes of the display apparatus 10 (e.g., see FIG. 17). Accordingly, the insulating film 380 prevents the damage to the light-emitting device core 300, and thus, a decrease in luminous efficiency of the display apparatus 10 that may occur due to the damage to the light-emitting device core 300 may be prevented. In addition, the insulating film 380 may prevent an electrical short-circuit that may occur when contact electrodes in contact with the light-emitting device ED to transfer electrical signals to the light-emitting device ED come into contact with the active layer 330.

In one or more embodiments, an outer surface (e.g., the outer peripheral or circumferential surface) of the insulating film 380 may be surface-treated. The light-emitting devices ED may be jetted onto and may be aligned on electrodes in a state in which they are dispersed in ink (e.g., a predetermined ink). Here, in order to maintain the light-emitting devices ED in a state in which the light-emitting devices ED are dispersed without being agglomerated with other adjacent light-emitting devices ED in the ink, a hydrophobic or hydrophilic treatment may be performed on the outer surface (e.g., the outer peripheral or circumferential surface) of the insulating film 380.

The light-emitting device ED may have a length in the range of 1 μm to 10 μm or 2 μm to 6 μm, and preferably 3 μm to 5 μm. In addition, a diameter of the light-emitting device ED may be different along the one direction (e.g., the X-axis direction), but may be in the range of 30 nm to 700 nm. The light-emitting device ED may have an aspect ratio of 1.2 to 100.

Figure 3:
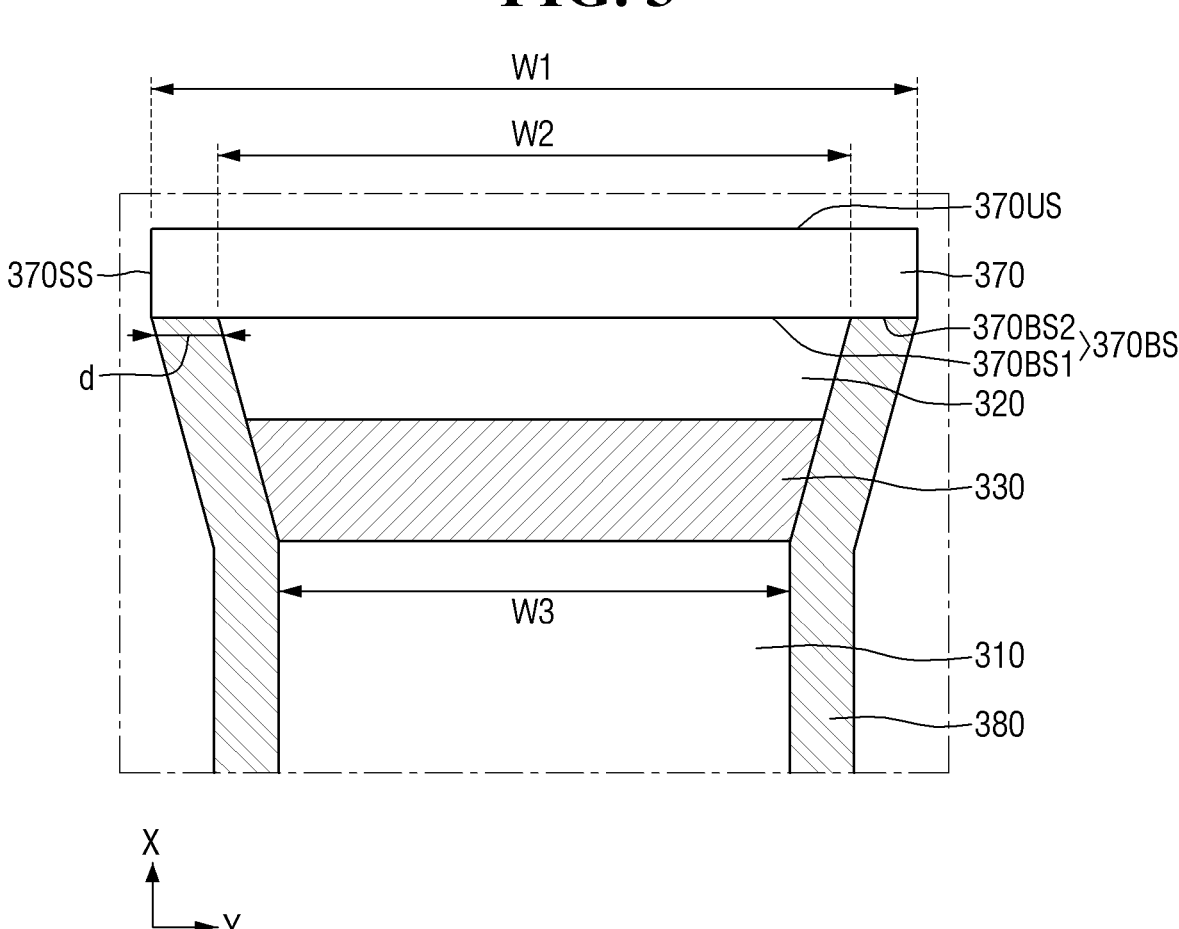
FIG. 3 is an enlarged cross-sectional view of one end of the light-emitting device of FIG. 2.

FIG. 3 is an enlarged cross-sectional view of one end of the light-emitting device of FIG. 2.

As described above, after the light-emitting devices ED are aligned in the manufacturing processes of the display apparatus 10, the process of forming the plurality of insulating layers on the light-emitting devices ED may be performed. Even though the insulating film 380 is around (e.g., surrounds) the side surface (e.g., the outer peripheral or circumferential surface) of the light-emitting device core 300, a portion of the insulating film 380 of the light-emitting device ED is also etched in the process of forming the plurality of insulating layers, such that a portion of the light-emitting device core 300 is exposed, and thus, the damage to the light-emitting device ED may occur. In addition, when the insulating film 380 is formed to expose a portion of an end of the light-emitting device core 300 in a process of forming the insulating film 380 from among manufacturing processes of the light-emitting device ED, the damage to the light-emitting device ED may also occur in the process of forming the plurality of insulating layers of the display apparatus 10. Accordingly, reliability of the display apparatus 10 may be improved by manufacturing the light-emitting device ED so that the insulating film 380 of the light-emitting device ED completely surrounds the side surface (e.g., the outer peripheral or circumferential surface) of the light-emitting device core 300 so as not to expose the side surface of the light-emitting device core 300.

Hereinafter, a relative arrangement between and diameters of the electrode layer 370, the light-emitting device core 300, and the insulating film 380 for the insulating film 380 of the light-emitting device ED to stably surround the side surface of the light-emitting device core 300 so as not to expose the side surface of the light-emitting device core 300 will be described in detail with reference to FIGS. 2 and 3.

The minimum diameter of the second semiconductor layer 320 of the light-emitting device core 300 may be greater than the maximum diameter of the first semiconductor layer 310. As described above, the diameter of the second semiconductor layer 320 may decrease from the electrode layer 370 toward the active layer 330. In addition, the diameter of the active layer 330 may decrease from the second semiconductor layer 320 toward the first semiconductor layer 310. A minimum diameter of the active layer 330 may be the same as or greater than the diameter (or the maximum diameter) of the first semiconductor layer 310. Accordingly, a maximum diameter of the light-emitting device core 300 may be the diameter of the upper surface of the second semiconductor layer 320. The first semiconductor layer 310, the active layer 330, and the second semiconductor layer 320 may be sequentially stacked along the one direction (e.g., the X-axis direction), boundary surfaces of respective members may be positioned at the same plane, and diameters of the boundary surfaces in contact with each other may be substantially the same as each other.

The electrode layer 370 may include one surface 370US, the other surface 370BS, and a side surface 370SS. The other surface 370BS of the electrode layer 370 may be opposite to one surface 370US of the electrode layer 370. In the drawings, one surface 370US of the electrode layer 370 may be referred to as an upper surface 370US, and the other surface 370BS of the electrode layer 370 may be referred to as a lower surface 370BS.

The upper surface 370US of the electrode layer 370 may form one end surface of the light-emitting device ED. The lower surface 370BS of the electrode layer 370 may be a surface toward the second semiconductor layer 320.

The electrode layer 370 may be disposed on the light-emitting device core 300 and protrude in a thickness direction of the insulating film 380.

The side surface 370SS of the electrode layer 370 may protrude outward from the side surface of the light-emitting device core 300. The diameter W1 of the electrode layer 370 may be greater than the maximum diameter W2 of the light-emitting device core 300. In one or more embodiments, the side surface of the electrode layer 370 may protrude outward from the side surface of the second semiconductor layer 320. The diameter W1 of the electrode layer 370 may be greater than the diameter W2 of the upper surface of the second semiconductor layer 320. A protrusion length of the side surface of the electrode layer 370 protruding outward from the second semiconductor layer 320 may be in the range of about 20 nm to about 120 nm, but is not limited thereto.

The lower surface 370BS of the electrode layer 370 may include a first region 370BS1 and a second region 370BS2. The first region 370BS1 may be a region of the lower surface 370BS of the electrode layer 370 that overlaps the second semiconductor layer 320 in the one direction (e.g., the X-axis direction), and the second region 370BS2 may be a region of the lower surface 370BS of the electrode layer 370 that does not overlap the second semiconductor layer 320 in the one direction (e.g., the X-axis direction). Alternatively, the first region 370BS1 may be a region of the lower surface 370BS of the electrode layer 370 that is in contact with the second semiconductor layer 320, and the second region 370BS2 may be a region of the lower surface 370BS of the electrode layer 370 that is not in contact with the second semiconductor layer 320 and is thus exposed.

The second semiconductor layer 320 may generally overlap the electrode layer 370 in the one direction (e.g., the X-axis direction) at a central portion of the electrode layer 370. Accordingly, the second region 370BS2 may be disposed to surround the first region 370BS1. An area of the first region 370BS1 may be greater than an area of the second region 370BS2.

As described above, the insulating film 380 may be disposed to be in direct contact with the side surface (e.g., the outer peripheral or circumferential surface) of the light-emitting device core 300 and may be around (e.g., may surround) the side surface (e.g., the outer peripheral or circumferential surface) of the light-emitting device core 300. The insulating film 380 may be directly disposed on the side surfaces (e.g., the outer peripheral or circumferential surfaces) of the first semiconductor layer 310, the second semiconductor layer 320, and the active layer 330.

The insulating film 380 may be disposed on the lower surface 370BS of the electrode layer 370 exposed by the second semiconductor layer 320. The insulating film 380 may be in contact with the lower surface 3708BS of the electrode layer 370 exposed by the second semiconductor layer 320. Specifically, the insulating film 380 may be in contact with the second region 370BS2 of the electrode layer 370. The insulating film 380 may be disposed to completely cover the second region 370BS2. A contact area between the insulating film 380 and the electrode layer 370 may be the same as the area of the second region 370BS2. The diameter W1 of the lower surface 3708BS of the electrode layer 370 may be the same as the sum of the diameter W2 of the upper surface of the second semiconductor layer 320 and twice the thickness d of the insulating film 380. In one or more embodiments, the insulating film 380 and the second semiconductor layer 320 may be disposed below the electrode layer 370 so as to completely cover the lower surface 370BS of the electrode layer 370. However, the present disclosure is not limited thereto, and a portion of the lower surface 370BS of the electrode layer 370 may also be exposed by the second semiconductor layer 320 and the insulating film 380.

The insulating film 380 may expose at least a portion of the side surface 370SS of the electrode layer 370. In one or more embodiments, the insulating film 380 may not be disposed on the side surface 370SS of the electrode layer 370. The insulating film 380 may be disposed to expose the upper surface 370US and the side surface 370SS of the electrode layer 370. A diameter of the outer surface (e.g., the outer peripheral or circumferential surface) of the insulating film 380 on the lower surface 370BS of the electrode layer 370 may be the same as the thickness d of the insulating film 380. The insulating film 380 may not be disposed on the upper surface 370US and the side surface 370SS of the electrode layer 370 and may be disposed only on the second region 370BS2 of the electrode layer 370, so as to expose the upper surface 370US and the side surface 370SS of the electrode layer 370. However, the present disclosure is not limited thereto, and in one or more embodiments, the insulating film 380 may also be disposed on the second region 370BS2 of the electrode layer 370 and the side surface 370SS of the electrode layer 370. This will be described later with reference to other drawings.

The light-emitting device ED according to the embodiment of FIGS. 1-3 may have an under-cut shape in which the electrode layer 370 includes a tip portion protruding from the second semiconductor layer 320 because the side surface 370SS of the electrode layer 370 is formed to protrude outward from the side surface of the light-emitting device core 300. Accordingly, in a third etching process for forming the insulating film 380 to be described later, an insulating coating 3800 (see FIG. 8) disposed below the electrode layer 370 may be protected by the electrode layer 370 to remain without being removed, at the tip portion of the electrode layer 370. Accordingly, the insulating film 380 may be formed to completely surround the second semiconductor layer 320 and the active layer 330 without exposing some regions of the second semiconductor layer 320 and the active layer 330, by the tip portion of the electrode layer 370.

Accordingly, the reliability of the display apparatus 10 may be improved by preventing damage to the light-emitting device ED that may occur due to exposure of a partial region of the side surface of the light-emitting device core 300.

In addition, in the light-emitting device ED according to the embodiment of FIGS. 1-3, the active layer 330 may have a truncated cone shape in which the diameter of the lower surface thereof is smaller than the diameter of the upper surface thereof. Accordingly, a diameter of the first semiconductor layer 310 of the light-emitting device ED according to the embodiment of FIGS. 1-3 may be smaller than a diameter of a first semiconductor layer 310 disposed below an active layer having a cylindrical shape and having the same volume as the active layer 330. Accordingly, the total volume and/or weight of the first semiconductor layer 310 occupying most of the region of the light-emitting device ED in the one direction (e.g., the X-axis direction) may be decreased. Accordingly, the weight of the first semiconductor layer 310 is decreased, such that the total weight of the light-emitting device ED is decreased, and thus, a dispersion holding time of the light-emitting devices ED dispersed in the ink may be increased in an inkjet printing process using the ink in which the light-emitting devices ED are dispersed from among the manufacturing processes of the display apparatus 10.

Hereinafter, manufacturing processes of a light-emitting device according to one or more embodiments will be described with reference to FIGS. 4 to 10.

FIGS. 4 to 10 are cross-sectional views illustrating manufacturing processes of the light-emitting device according to one or more embodiments. Hereinafter, a description of a method, a process condition, or the like, for forming a plurality of semiconductor layers will be omitted, and a sequence of a manufacturing method for the light-emitting device or a stacked structure of the light-emitting device will be described in detail.

First, a lower substrate 1000 is prepared.

Figure 4:
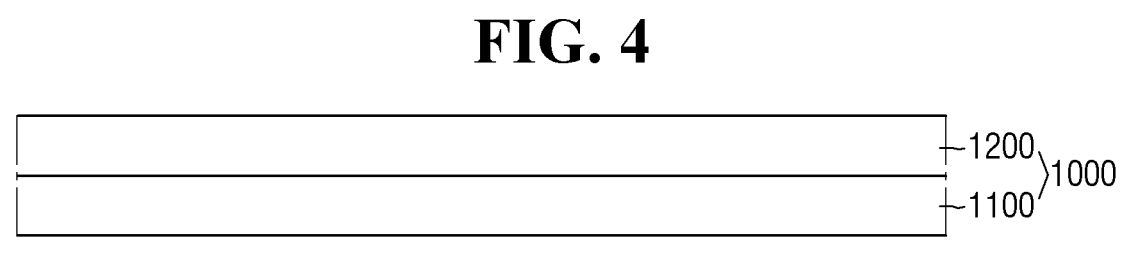

Referring to FIG. 4, the lower substrate 1000 including a base substrate 1100 and a buffer material layer 1200 formed on the base substrate 1100 is prepared. The base substrate 1100 may include a sapphire ($AlO_x$) substrate and a transparent substrate such as a glass substrate. However, the present disclosure is not limited thereto, and the base substrate 1100 may also be formed as a conductive substrate made of GaN, SiC, ZnO, Si, GaP, GaAs, and the like. Hereinafter, a case where the base substrate 1100 is a sapphire ($AlO_x$) substrate will be described by way of example. A thickness of the base substrate 1100 is not particularly limited, but the base substrate 1100 may have a thickness in the range of 400 μm to 1500 μm as an example.

A plurality of semiconductor layers are formed on the base substrate 1100. The plurality of semiconductor layers grown by an epitaxial method may be formed by growing a seed crystal. Here, a method of forming the semiconductor layers may be electron beam deposition, physical vapor deposition (PVD), chemical vapor deposition (CVD), plasma laser deposition (PLD), dual-type thermal evaporation, sputtering, metal organic chemical vapor deposition (MOCVD), or the like, and preferably, metal-organic chemical vapor deposition (MOCVD). However, the present disclosure is not limited thereto.

The buffer material layer 1200 is formed on the base substrate 1100. It has been illustrated in FIG. 4 that the buffer material layer 1200 is stacked as a single layer, but the present disclosure is not limited thereto, and the buffer material layer 1200 may also be formed as a plurality of layers. The buffer material layer 1200 may be disposed in order to decrease a difference in lattice constant between a first semiconductor 3100 (see FIG. 5) to be described later and the base substrate 1100.

As an example, the buffer material layer 1200 may include an undoped semiconductor, and may include a material that is substantially the same as that of the first semiconductor 3100, but is not doped with an n-type or p-type dopant. In one or more embodiments, the buffer material layer 1200 may be made of at least one of undoped InAlGaN, GaN, AlGaN, InGaN, AlN, and InN, but is not limited thereto. In addition, the buffer material layer 1200 may be omitted according to the base substrate 1100. Hereinafter, a case where the buffer material layer 1200 including an undoped semiconductor is formed on the base substrate 1100 will be described by way of example.

Next, a first stacked structure 3000 is formed on the lower substrate 1000.

Figure 5:
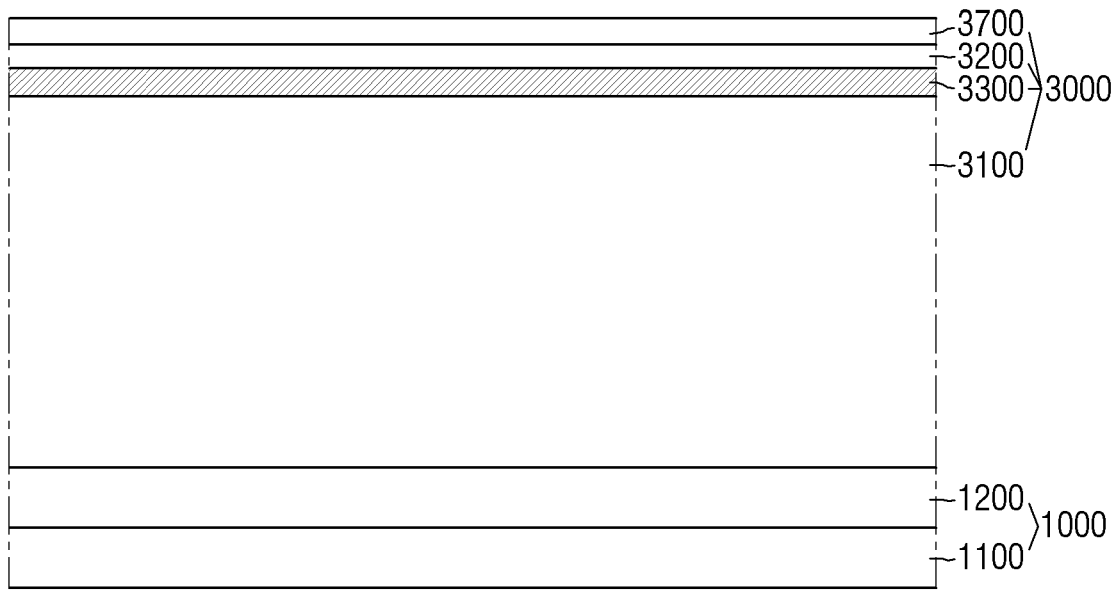

Referring to FIG. 5, the first stacked structure 3000 may include a first semiconductor 3100, an active layer 3300, a second semiconductor 3200, and an electrode material layer 3700. The first stacked structure 3000 may have a structure in which the first semiconductor 3100, the active layer 3300, the second semiconductor 3200, and the electrode material layer 3700 are sequentially stacked. A plurality of material layers included in the first stacked structure 3000 may be formed by performing a general process as described above.

The plurality of material layers included in the first stacked structure 3000 may correspond to respective layers included in the light-emitting device ED according to one or more embodiment. Specifically, the first semiconductor 3100, the active layer 3300, the second semiconductor 3200, and the electrode material layer 3700 of the first stacked structure 3000 may be layers including the same materials as the materials included in the first semiconductor layer 310, the active layer 330, the second semiconductor layer 320, and the electrode layer 370 of the light-emitting device ED respectively.

Next, a plurality of second stacked structures 3000' that are spaced from each other are formed by performing a first etching process of etching the first stacked structure 3000.

Figure 6:
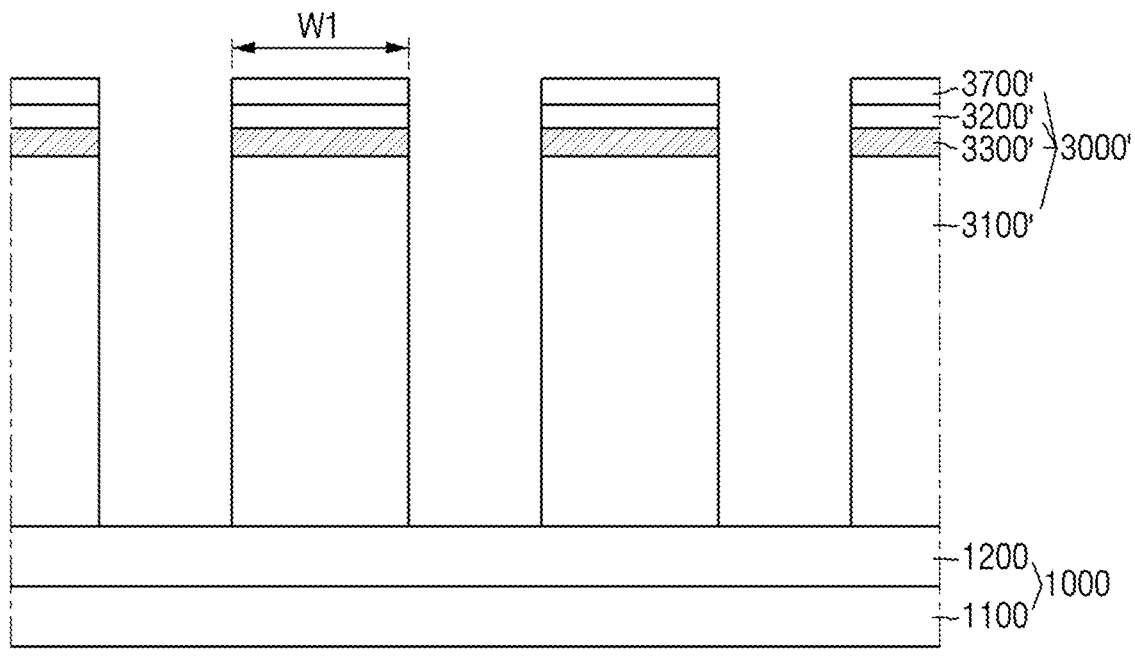

Referring to FIG. 6, holes are formed by performing the first etching process of etching partial regions of the first stacked structure 3000, and the plurality of second stacked structures 3000' that are spaced from each other on the basis of the holes are formed. A diameter W1 of the second stacked structure 3000' may be substantially the same as the diameter W1 of the electrode layer 370 of the light-emitting device ED described above.

The first stacked structure 3000 may be etched by a general method. For example, the second stacked structures 3000' may be formed by forming an etch mask layer on the first stacked structure 3000 and etching the first stacked structure 3000 along the mask layer in a direction perpendicular to the lower substrate 1000.

For example, the first etching process of etching the first stacked structure 3000 to form the second stacked structures 3000' may be a dry etching method, a wet etching method, a reactive ion etching (RIE) method, an inductively coupled plasma reactive ion etching (ICP-RIE) method, or the like. In a case of the dry etching method, anisotropic etching is possible, and the dry etching method may thus be suitable for vertical etching. When the above-described etching method is used, an etchant may be $Cl_2$, $O_2$, or the like. However, the present disclosure is not limited thereto.

In one or more embodiments, the second stacked structures 3000' may be formed by etching the first stacked structure 3000 in a depth direction by the dry etching method. It has been illustrated in FIG. 6 that side surfaces of the second stacked structures 3000' is perpendicular to an upper surface of the lower substrate 1000, but the side surfaces of the second stacked structures 3000' may also be formed to be inclined with respect to the upper surface of the lower substrate 1000 by the first etching process.

Next, a structure in which an electrode material layer 3700' protrudes from a side surface of the light-emitting device core 300 is formed by a second etching process of etching the second stacked structure 3000'.

Figure 7:
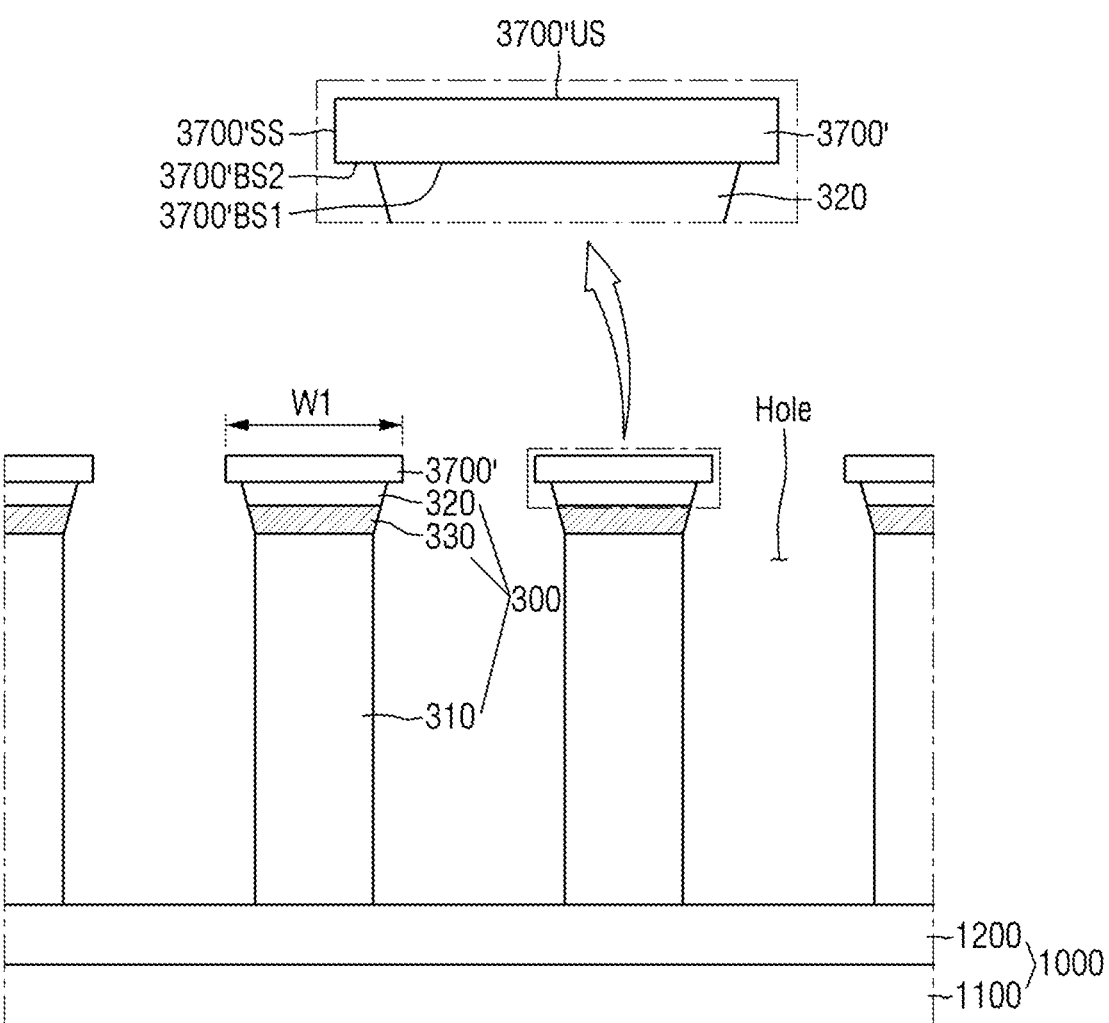

Referring to FIG. 7, by performing the second etching process of etching the second stacked structure 3000', the side surface of the second semiconductor layer 320 of the light-emitting device core 300 may be aligned inside a side surface of the electrode material layer 3700'.

In one or more embodiments, the second etching process of forming the structure in which the electrode material layer 3700' protrudes from the side surface of the light-emitting device core 300 may be performed by a wet etching method. The second etching process may be performed using an etchant. The etchant used in the second etching process may have different etch rates (etch selectivity) for respective layers of the second stacked structure 3000'.

For example, an etch rate of the etchant for a first semiconductor 3100' may be greater than etch rates of the etchant for a second semiconductor 3200', an active layer 3300', and the electrode material layer 3700'. An etch rate of the etchant for the second semiconductor 3200' may be greater than an etch rate of the etchant for the electrode material layer 3700'. An etch rate of the etchant for the active layer 3300' may be greater than an etch rate of the etchant for the electrode material layer 3700' and an etch rate of the etchant for the second semiconductor 3200'. In one or more embodiments, the etchant may include an etchant composition that may not etch the electrode material layer 3700'. Accordingly, the electrode material layer 3700' may be maintained to have the same diameter without being etched by the second etching process. The structure in which the electrode material layer 3700' protrudes from the side surface of the light-emitting device core 300 may be formed by adjusting a process time of the second etching process using a difference between the etch rates of the etchant for the respective layers of the second stacked structure 3000'.

The side surface of the electrode material layer 3700' protrudes from the side surface of the second semiconductor layer 320 through the second etching process, such that a lower surface 3700'BS of the electrode material layer 3700' may include a first region 3700'BS1 that overlaps the second semiconductor layer 320 and a second region 3700'BS2 that does not overlap the second semiconductor layer 320. That is, the side surface of the electrode material layer 3700' protrudes from the side surface of the second semiconductor layer 320, such that an under-cut shape including a tip portion may be formed. A protrusion length of the electrode material layer 3700' protruding outward from the second semiconductor layer 320 due to the under-cut shape may be in the range of 20 nm to 120 nm, but is not limited thereto. Through the second etching process, the electrode material layer 3700' may protrude from the side surface of the light-emitting device core 300, and a tapered angle may be formed on the side surfaces of the second semiconductor layer 320 and the active layer 330.

Next, an insulating coating 3800 around (e.g., surrounding) outer surfaces (e.g., outer peripheral or circumferential surfaces) of the light-emitting device core 300 and the electrode material layer 3700' is formed.

Figure 8:
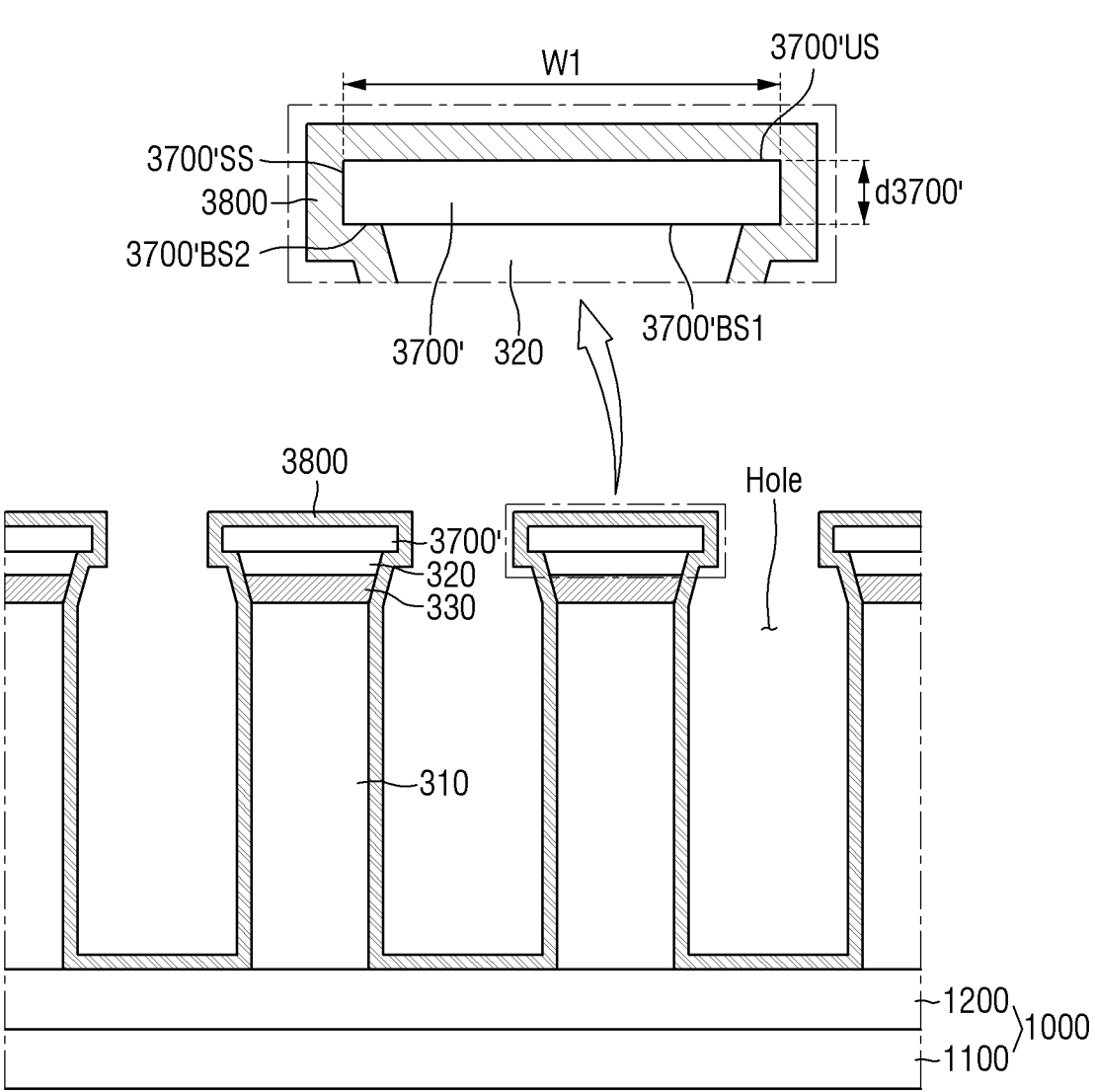

Referring to FIG. 8, the insulating coating 3800 may be formed to completely cover the outer surfaces (e.g., outer peripheral or circumferential surfaces) of the light-emitting device core 300 and the electrode material layer 3700'. Specifically, the insulating coating 3800 may be formed to completely cover the side surface of the light-emitting device core 300 and an upper surface 3700'US, a side surface 3700'SS, and the second region 3700'BS2 of the electrode material layer 3700'. The insulating coating 3800 may also be formed on a front surface of the lower substrate 1000 to be formed on the buffer material layer 1200 exposed by the light-emitting device core 300.

The insulating coating 3800 may include an insulating material included in the insulating film 380 of the light-emitting device ED. The insulating coating 3800 may be formed by a method of applying an insulating material to the outer surfaces (e.g., outer peripheral or circumferential surfaces) of the light-emitting device core 300 and the electrode material layer 3700', a method of immersing the outer surfaces (e.g., outer peripheral or circumferential surfaces) of the light-emitting device core 300 and the electrode material layer 3700' in an insulating material, or the like. However, the present disclosure is not limited thereto. As an example, the insulating coating 3800 may be formed by atomic layer deposition (ALD). It has been illustrated in FIG. 8 that the insulating coating 3800 is formed as a single film, but the present disclosure is not limited thereto. When the insulating film 380 includes a double film including a plurality of insulating material layers, the insulating coating 3800 may be formed by sequentially stacking a plurality of insulating coatings.

Then, a portion of the insulating coating 3800 is removed by performing a third etching process.

Figure 9:
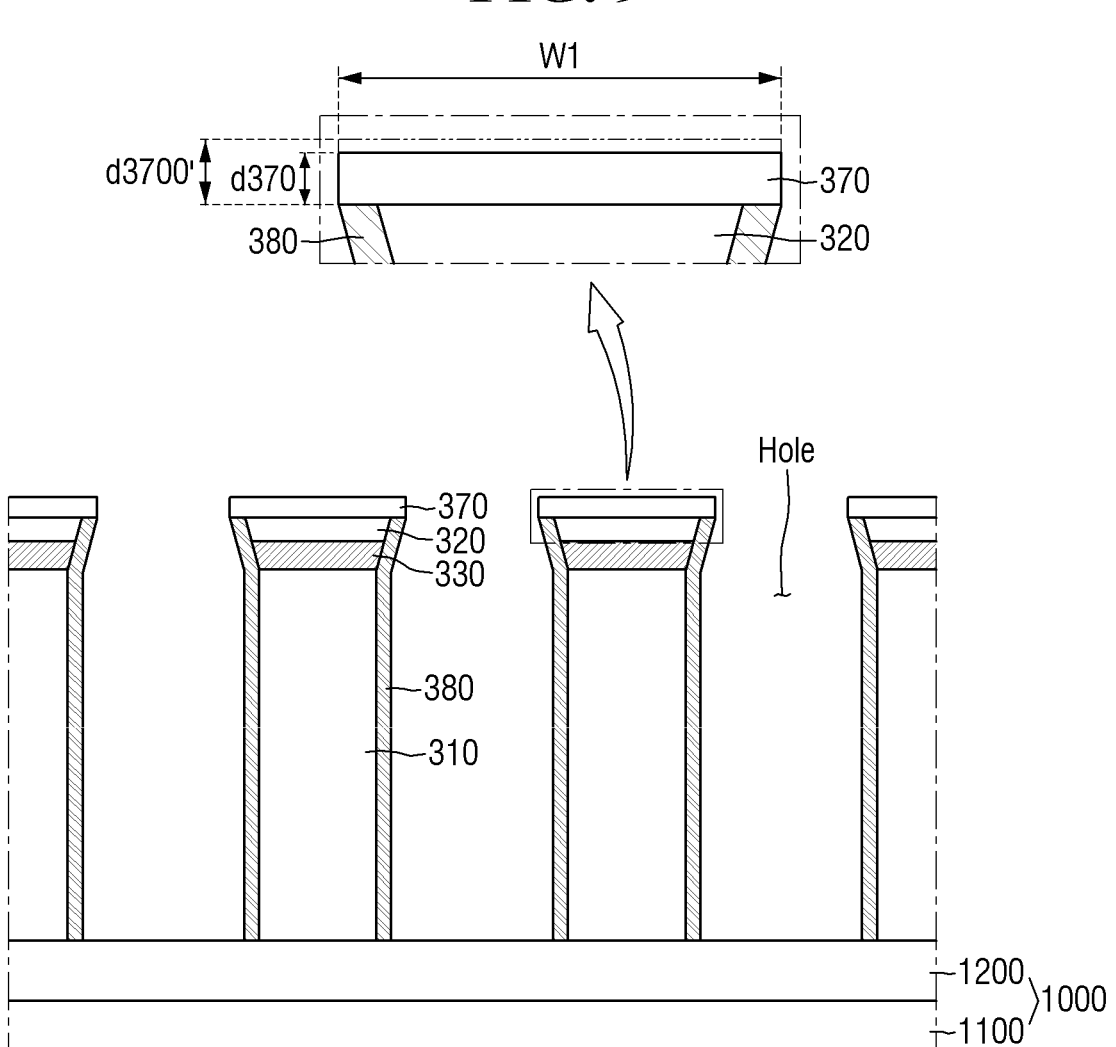

Referring to FIG. 9 in conjunction with FIG. 8, the upper surface 3700'US and the side surface 3700'SS of the electrode material layer 3700' are exposed by performing the third etching process of removing a portion of the insulating coating 3800.

As a process of partially removing the insulating coating 3800, a process such as dry etching or etch-back, which is anisotropic etching, may be performed. The insulating coating 3800 is removed through the third etching process, such that the upper surface 370US and the side surface 370SS of the electrode layer 370 may be exposed (e.g., see FIG. 3), and the insulating coating 3800 around (e.g., surrounding) the side surface (e.g., outer peripheral or circumferential surface) of the light-emitting device core 300 may not be removed.

When an etch-back process is performed as the third etching process, the side surface 3700'SS of the electrode material layer 3700' protrudes from the side surface of the second semiconductor layer 320, such that the insulating coating 3800 formed below the second region 3700'BS2 of the electrode material layer 3700' may be protected by a tip structure of the electrode material layer 3700' and thus, may not be removed. That is, an under-cut shape in which the electrode material layer 3700' protrudes from the second semiconductor layer 320 is formed, and thus, the insulating film 380 around (e.g., surrounding) the second semiconductor layer 320 may not be removed. The upper surface 3700'US of the electrode material layer 3700' is partially etched through the third etching process, such that that a thickness d370 of the electrode layer 370 may be smaller than a thickness d3700' of the electrode material layer 3700'. However, the present disclosure is not limited thereto.

Figure 10:
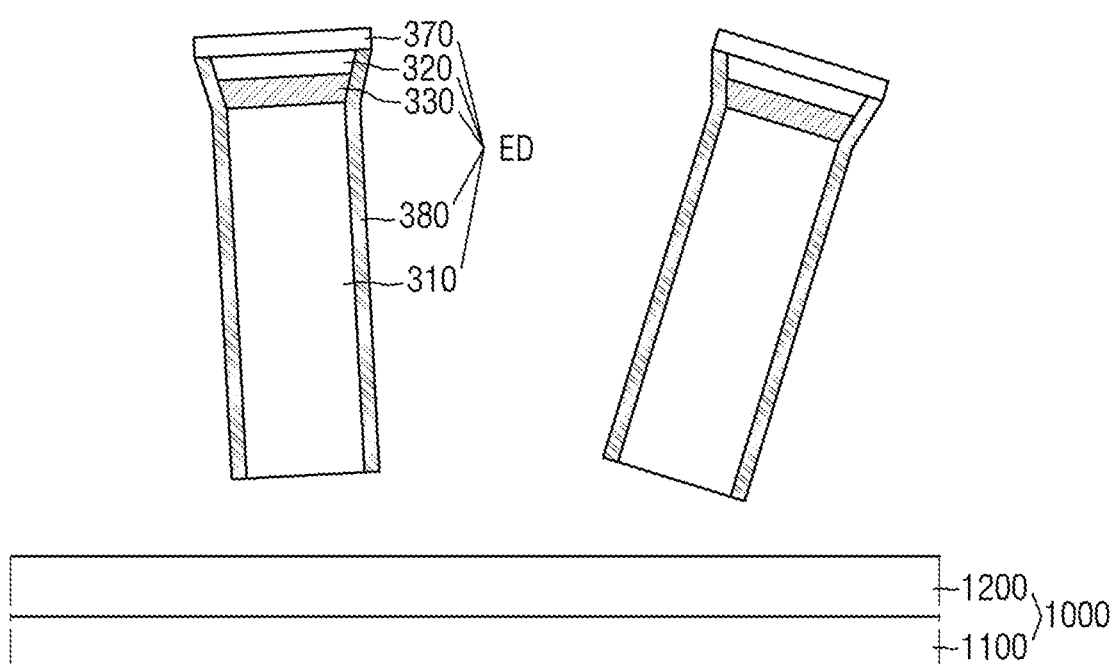

Next, referring to FIG. 10, the light-emitting device ED is separated from the lower substrate 1000. The light-emitting device ED according to one or more embodiments may be manufactured by separating a structure including the light-emitting device core 300, the electrode layer 370, and the insulating film 380 from the lower substrate 1000. A method of separating the structure including the light-emitting device core 300, the electrode layer 370, and the insulating film 380 from the lower substrate 1000 is not particularly limited. A process of separating the structure including the light-emitting device core 300, the electrode layer 370, and the insulating film 380 from the lower substrate 1000 may be performed by a physical separation method or a chemical separation method.

Hereinafter, other embodiments will be described. In the following embodiments, an overlapping description of the same components as those described above will be omitted or simplified, and components different from those described above will be mainly described.

Figure 11:
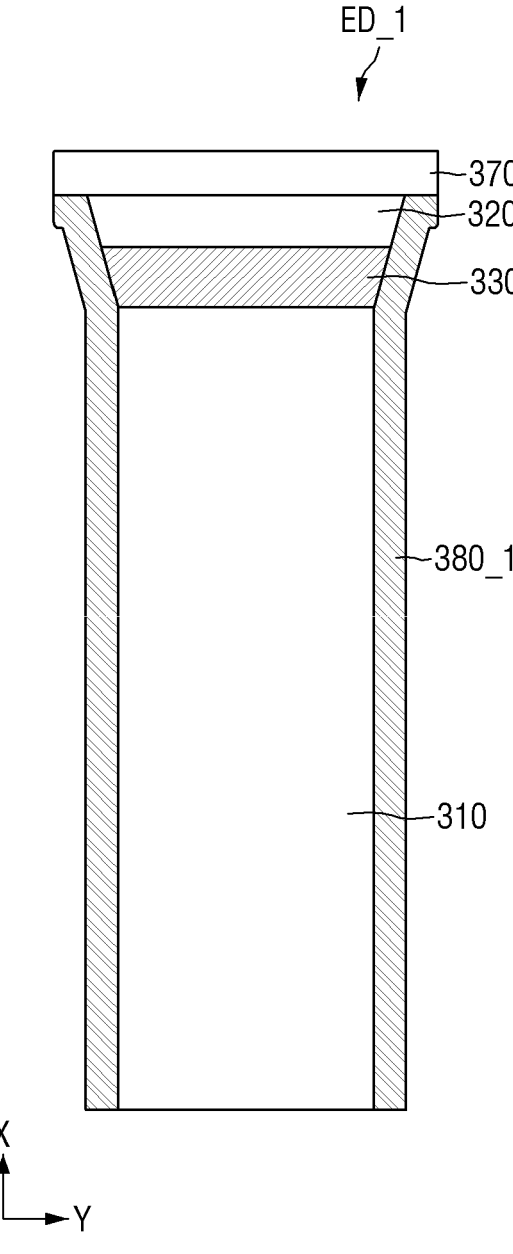
FIG. 11 is a cross-sectional view of a light-emitting device according to one or more embodiments.

FIG. 11 is a cross-sectional view of a light-emitting device according to one or more embodiments.

Referring to FIG. 11, a light-emitting device ED_1 according to the current embodiment is different from the light-emitting device according to the embodiment of FIG. 2 in that a thickness of an insulating film 380_1 in a region adjacent to the electrode layer 370 is different for each region.

Specifically, a thickness of the insulating film 380_1 around (e.g., surrounding) the side surface (e.g., the outer peripheral or circumferential surface) of the light-emitting device core 300 may be substantially the same. However, the insulating film 380_1 disposed in a region adjacent to the second region 370BS2 of the electrode layer 370 may be protected by the tip portion of the electrode layer 370 and thus, may not be etched, in the third etching process of forming the insulating film 380_1 by removing the above-described insulating coating 3800. Accordingly, in the current embodiment, an outer surface (e.g., an outer peripheral or circumferential surface) of the insulating film 380_1 in the region adjacent to the second region 370BS2 of the electrode layer 370 may be aligned with the side surface 370SS of the electrode layer 370.

Figure 12:
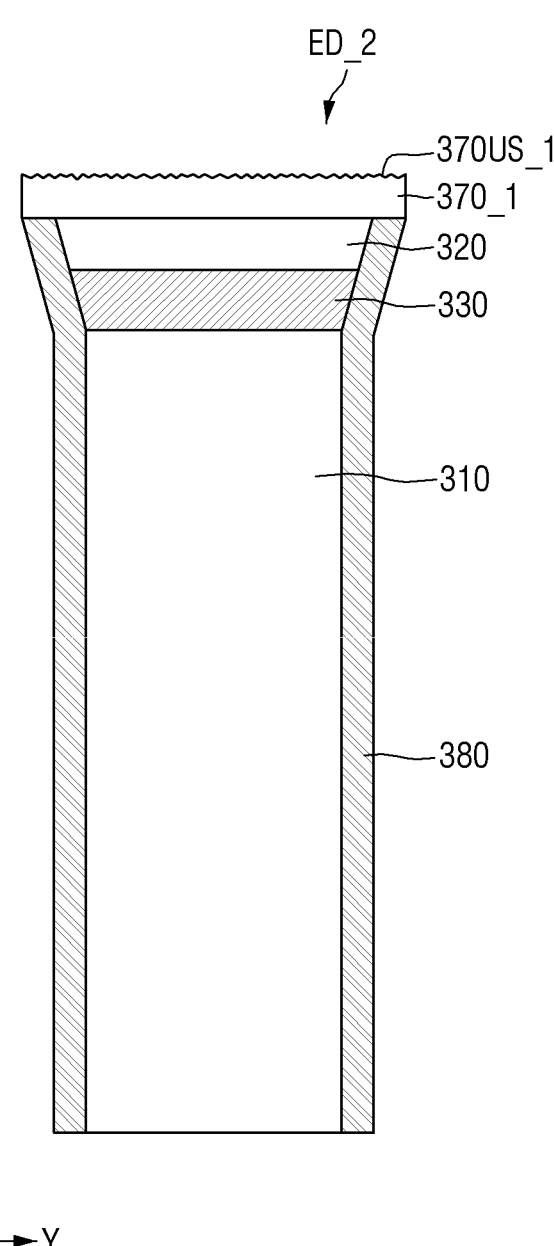
FIG. 12 is a cross-sectional view of a light-emitting device according to one or more embodiments.

FIG. 12 is a cross-sectional view of a light-emitting device according to one or more embodiments.

Referring to FIG. 12, a light-emitting device ED_2 according to the current embodiment is different from the light-emitting device according to the embodiment of FIG. 2 in that surface unevenness (or surface roughness) is formed on an upper surface 370US_1 of an electrode layer 370_1.

Specifically, the upper surface 370US_1 of the electrode layer 370_1 may include the surface unevenness. The surface unevenness may be formed in the third etching process of forming the insulating film 380 by removing the above-described insulating coating 3800. For example, when the etch-back process is performed as the third etching process, the upper surface 370 US_1 of the electrode layer 370_1 may also be partially etched to include the surface unevenness.

Figure 13:
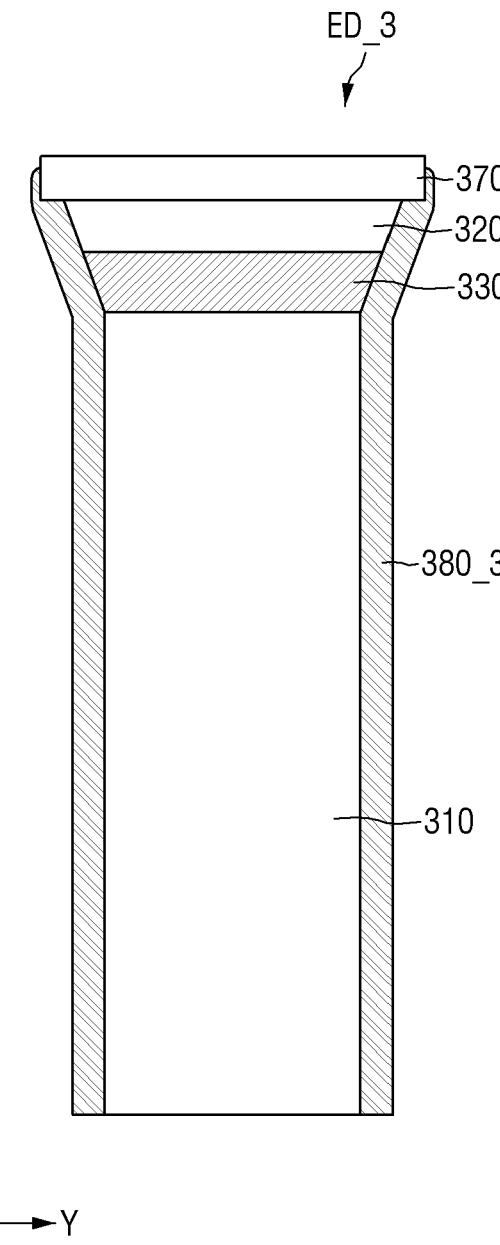
FIG. 13 is a cross-sectional view of a light-emitting device according to one or more embodiments.

FIG. 13 is a cross-sectional view of a light-emitting device according to one or more embodiments.

Referring to FIG. 13, a light-emitting device ED_3 according to the current embodiment is different from the light-emitting device according to the embodiment of FIG. 2 in that an insulating film 380_3 is also disposed on the side surface (e.g., the outer peripheral or circumferential surface) of the electrode layer 370.

Specifically, referring to FIG. 13 in conjunction with FIG. 3, the insulating film 380_3 may be disposed on the second region 370BS2 of the electrode layer 370, and may extend outward to be partially disposed on the side surface 370SS of the electrode layer 370. However, the insulating film 380_3 may be disposed on the side surface 370SS of the electrode layer 370, but may expose at least a portion of the side surface 370SS of the electrode layer 370. The side surface 370SS of the electrode layer 370 exposed by the insulating film 380_3 may be disposed adjacent to the upper surface 370US of the electrode layer 370.

A thickness of the insulating film 3803 may be different for each region. A thickness of the insulating film 380_3 around (e.g., surrounding) the side surface of the light-emitting device core 300 may be different from a thickness of the insulating film 380_3 disposed on the side surface 370SS of the electrode layer 370. Specifically, the thickness of the insulating film 380_3 around (e.g., surrounding) the side surface of the light-emitting device core 300 may be greater than the thickness of the insulating film 380_3 disposed on the side surface 370SS of the electrode layer 370.

In addition, a thickness of the insulating film 3803 in contact with the electrode layer 370 may be different depending on a region in contact with the electrode layer 370. For example, a thickness of the second insulating film 380_3 in contact with the second region 370BS2 of the electrode layer 370 may be different from a thickness of the second insulating film 380_3 in contact with the side surface 370SS of the electrode layer 370. Specifically, the thickness of the second insulating film 380_3 in contact with the second region 370BS2 of the electrode layer 370 may be greater than the thickness of the second insulating film 380_3 in contact with the side surface 370SS of the electrode layer 370.

In the embodiment of FIG. 13, an outer surface (e.g., an outer peripheral or circumferential surface) of the insulating film 380_3 in a region adjacent to the second region 370BS2 of the electrode layer 370 may protrude outward from the side surface 370SS of the electrode layer 370.

When a process time of a third etching process of removing the insulating coating 3800 (see FIG. 8) in manufacturing processes of the light-emitting device ED_3 is short, the light-emitting device ED_3 according to the embodiment may be formed. Hereinafter, manufacturing processes of the light-emitting device ED_3 of FIG. 13 will be described with reference to FIGS. 14 and 15 in conjunction with FIG. 8.

Figure 14:
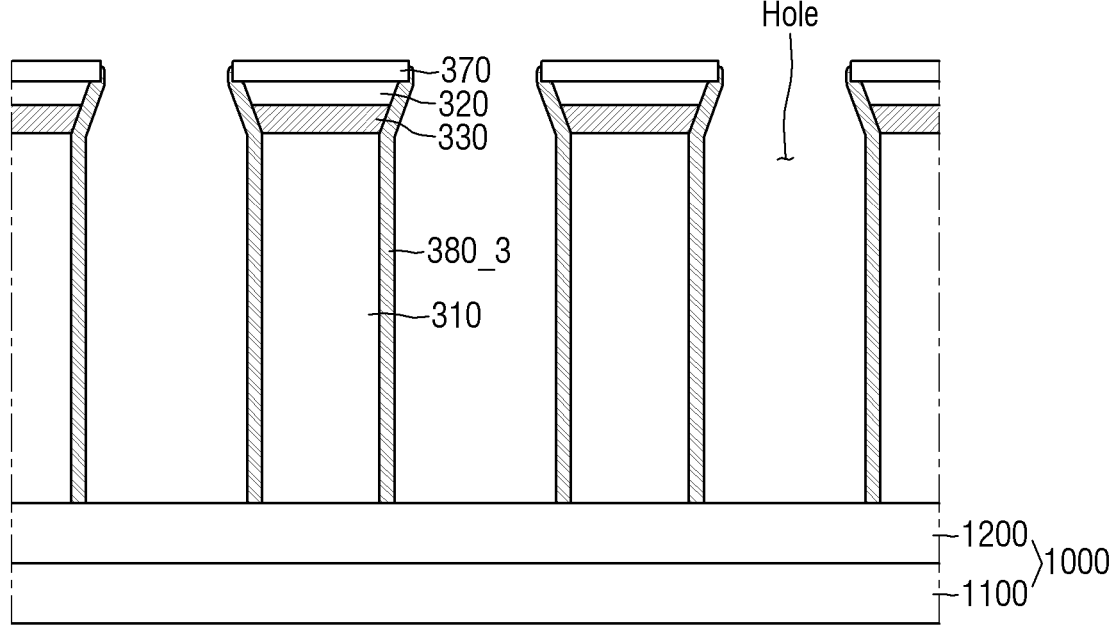
FIGS. 14 and 15 are cross-sectional views illustrating some of manufacturing processes of the light-emitting device of FIG. 13.
Figure 15:
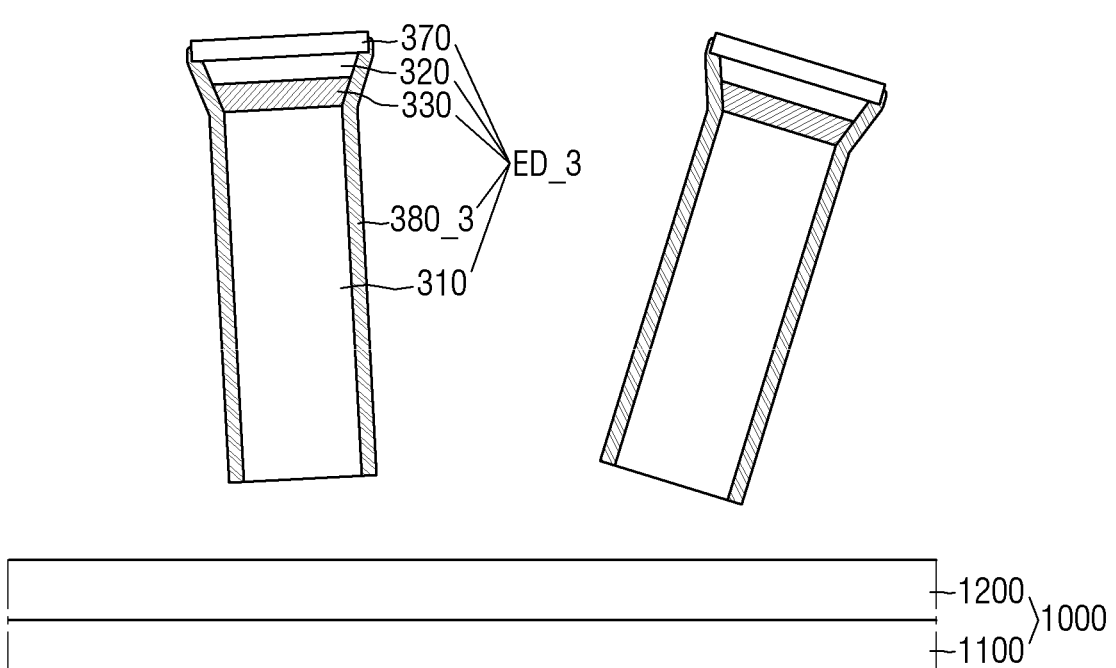

FIGS. 14 and 15 are cross-sectional views illustrating some of manufacturing processes of the light-emitting device of FIG. 13. FIGS. 14 and 15 are cross-sectional views illustrating an example of the third etching process for forming the insulating film 380_3 of the light-emitting device ED_3.

Referring to FIG. 14 in conjunction with FIGS. 7 and 8, in the third etching process according to the current embodiment, the upper surface 3700'US and a portion of the side surface 3700'SS of the electrode material layer 3700' are exposed by removing a portion of the insulating coating 3800. Through the third etching process, the insulating coating 3800 disposed on the upper surface 3700'US of the electrode material layer 3700' may be completely removed, and the insulating coating 3800 disposed on the side surface 3700'SS of the electrode material layer 3700' may be only partially removed. The insulating coating 3800 removed by the third etching process may include an insulating coating 3800 disposed on the side surface 3700'SS of the electrode material layer 3700', but disposed adjacent to the upper surface 3700'US of the electrode material layer 3700'.

As a process of partially removing the insulating coating 3800, the process such as the dry etching or the etch-back, which is the anisotropic etching described above, may be performed. A process time of the third etching process of the current embodiment may be shorter than a process time of the third etching process of the light-emitting device ED according to the embodiment described above with reference to FIG. 9. Accordingly, in the insulating coating 3800 disposed on the side surface 3700'SS of the electrode material layer 3700', the insulating coating 3800 disposed at a lower portion of the side surface 3700'SS is not completely removed, such that the insulating coating 3800 may partially remain on the side surface 3700'SS of the electrode material layer 3700'. However, also in this case, a portion of the insulating coating 3800 disposed on the side surface 3700'SS of the electrode material layer 3700' is etched, such that a thickness of the insulating film 380_3 disposed on the side surface 3700'SS of the electrode layer 370 may be smaller than a thickness of the insulating film 380_3 disposed on the side surface of the light-emitting device core 300 as illustrated in FIG. 14.

However, the present disclosure is not limited thereto, and in one or more embodiments, the process time of the third etching process may be the same as the process time of the third etching process of the light-emitting device ED according to one or more embodiments described above with reference to FIG. 9, but the insulating coating 3800 may partially remain on the side surface 3700'SS of the electrode material layer 3700' using a separate mask.

Next, referring to FIG. 15, the light-emitting device ED_3 is separated from the lower substrate 1000. A detailed description of a process of separating the light-emitting device ED_3 from the lower substrate 1000 will be replaced with (or may be similar to) the description provided above with reference to FIG. 10, and thus be omitted.

Figure 16:
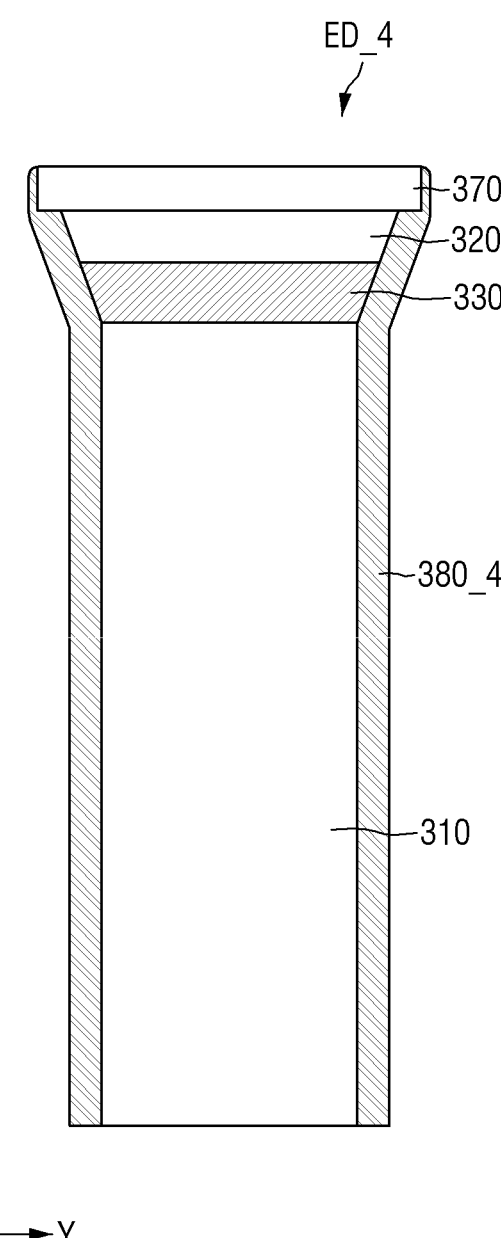
FIG. 16 is a cross-sectional view of a light-emitting device according to one or more embodiments.

FIG. 16 is a cross-sectional view of a light-emitting device according to one or more embodiments.

Referring to FIG. 16, a light-emitting device ED_4 according to the current embodiment is different from the light-emitting device according to the embodiment of FIG. 13 in that an insulating film 3804 is disposed to completely cover the side surface of the electrode layer 370.

Specifically, referring to FIG. 16, the insulating film 380_4 may be disposed on the second region 370BS2 of the electrode layer 370, and may extend outward to be disposed to completely cover the side surface 370SS of the electrode layer 370. The insulating film 380_4 may be disposed to completely cover the side surface 370SS of the electrode layer 370.

FIG. 17 is a plan view of a display apparatus according to one or more embodiments.

Referring to FIG. 17, a display apparatus 10 displays a moving image or a still image. The display apparatus 10 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display apparatus 10.

The display apparatus 10 includes a display panel providing the display screen. Examples of the display panel may include an inorganic light emitting diode display panel, an organic light emitting display panel, a quantum dot light emitting display panel, a plasma display panel, a field emission display panel, and the like. Hereinafter, a case where an inorganic light emitting diode display panel is applied as an example of the display panel will be described by way of example, but the present disclosure is not limited thereto, and the same technical spirit may be applied to other display panels if applicable.

Hereinafter, a first direction DR1, a second direction DR2, and a third direction DR3 are defined in the drawings of an embodiment for describing the display apparatus 10. The first direction DR1 and the second direction DR2 may be directions perpendicular to each other in one plane. The third direction DR3 may be a direction perpendicular to the plane in which the first direction DR1 and the second direction DR2 are positioned. The third direction DR3 is perpendicular to each of the first direction DR1 and the second direction DR2. In one or more embodiments for describing the display apparatus 10, the third direction DR3 refers to a thickness direction of the display apparatus 10.

The display apparatus 10 may have a rectangular shape, in a plan view, in which the first direction DR1 is longer than the second direction DR2 and which includes long sides and short sides. A corner portion where the long side and the short side of the display apparatus 10 meet in a plan view may be right-angled, but is not limited thereto, and may also have a rounded curved shape. A shape of the display apparatus 10 is not limited to those described above, and may be variously modified. For example, the shape of the display apparatus 10 may also be other shapes such as a square shape, a quadrangular shape with rounded corners (vertices), other polygonal shapes, and a circular shape in a plan view.

A display surface of the display apparatus 10 may be disposed on one side in the third direction DR3, which is the thickness direction. In one or more embodiments for describing the display apparatus 10, unless otherwise stated, "upper portion" refers to one side in the third direction DR3 and refers to a display direction, and "upper surface" refers to a surface toward one side in the third direction DR3. In addition, "lower portion" is the other side in the third direction DR3 and refers to a direction opposite to the display direction, and "lower surface" refers to a surface toward the other side in the third direction DR3. In addition, "left", "right", "upper", and "lower" refer to directions when the display apparatus 10 is viewed in a plan view. For example, "right side" refers to one side in the first direction DR1, "left side" refers to the other side in the first direction DR1, "upper side" refers to one side in the second direction DR2, and "lower side" refers to the other side in the second direction DR2.

The display apparatus 10 may include a display area DA and a non-display area NDA. The display area DA is an area in which an image may be displayed, and the non-display area NDA is an area in which no image is displayed. The display area DA may also be referred to as an active area, and the non-display area NDA may also be referred to as a non-active area.

A shape of the display area DA may follow the shape of the display apparatus 10. For example, the shape of the display area DA may have a rectangular shape in a plan view, similar to the overall shape of the display apparatus 10. The display area DA may occupy substantially the center (or a central region) of the display apparatus 10.

The display area DA may include a plurality of pixels PX. The plurality of pixels PX may be arranged in a matrix direction. For example, the plurality of pixels PX may be arranged along rows and columns of a matrix. A shape of each pixel PX may be a rectangular or square shape in a plan view. However, the present disclosure is not limited thereto, and the shape of each pixel PX may be a rhombic shape in which each side is inclined with respect to one direction. The respective pixels PX may be alternately arranged in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the present disclosure is not limited thereto, and various known embodiments may be applied.

The non-display area NDA may be disposed around the display area DA. The non-display area NDA may completely or partially surround the display area DA along an edge or periphery of the display area DA. In one or more embodiments, the display area DA may have a rectangular shape, and the non-display area NDA may be disposed adjacent to four sides of the display area DA. The non-display area NDA may constitute a bezel of the display apparatus 10. Lines, circuit drivers, or pad parts on which external devices are mounted, which are included in the display apparatus 10, may be disposed in the non-display area NDA.

Figure 18:
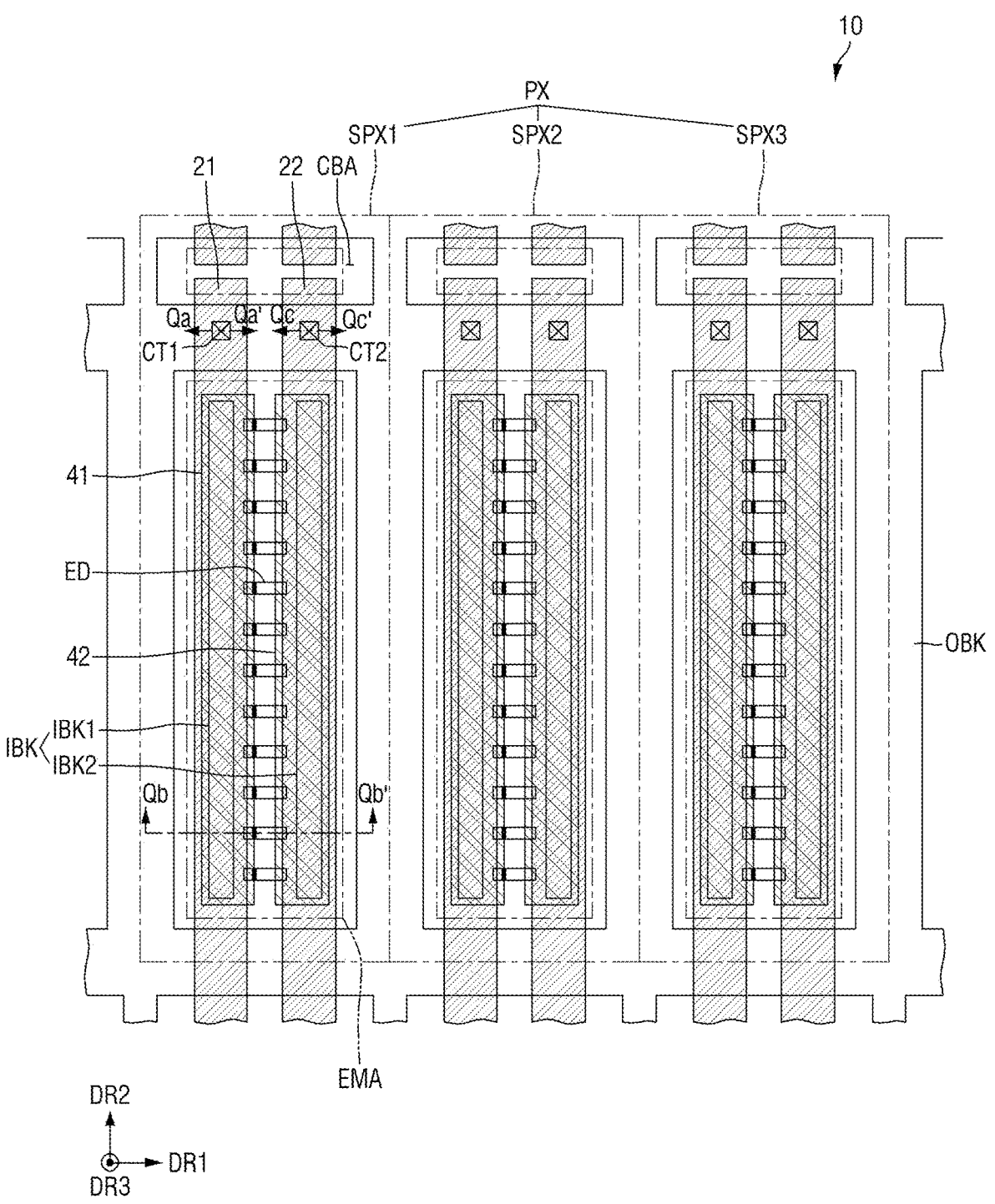
FIG. 18 is a schematic plan view of one pixel of the display apparatus according to one or more embodiments.
Figure 19:
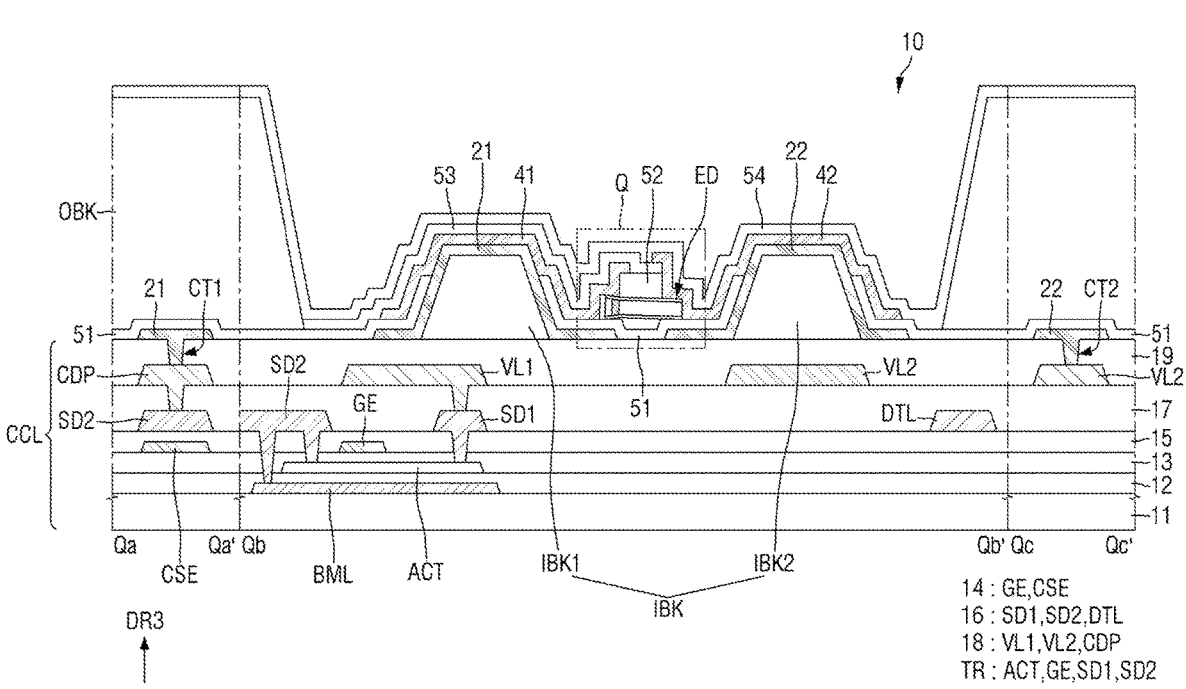
FIG. 19 is a cross-sectional view taken along the line Qaqa', line Ob-Qb', and line Qc-Qc' of FIG. 18.

FIG. 18 is a schematic plan view of one pixel of the display apparatus according to one or more embodiments. FIG. 19 is a cross-sectional view taken along the line Qa-Qa', the line Qb-Qb', and the line Qc-Qc' of FIG. 18.

Referring to FIG. 18, each pixel PX may include a plurality of sub-pixels SPX: SPX1, SPX2, and SPX3. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. The first color may be blue, the second color may be green, and the third color may be red. However, the present disclosure is not limited thereto, and the respective sub-pixels SPX1, SPX2, and SPX3 may also emit light of the same color. It has been illustrated in FIG. 18 that each pixel PX includes three sub-pixels SPX1, SPX2, and SPX3, but the present disclosure is not limited thereto, and each pixel PX may include a larger number of sub-pixels SPX.

Each of the sub-pixels SPX of the display apparatus 10 may include an emission area EMA and a non-emission area. The emission area EMA may be an area in which light emitted from light-emitting devices ED is emitted, and the non-emission area may be an area in which the light emitted from the light-emitting devices ED does not arrive and thus, the light is not emitted.

The emission area EMA may include an area in which the light-emitting devices ED are disposed and an area adjacent to the area in which the light-emitting devices ED are disposed. In addition, the emission area EMA may further include an area in which the light emitted from the light-emitting devices ED is reflected or refracted by other members and then emitted.

Each sub-pixel SPX may further include a cutout area CBA disposed in the non-emission area. The cutout area CBA may be disposed on one side of the emission area EMA in the second direction DR2. The cutout area CBA may be disposed between emission areas EMA of sub-pixels SPX adjacent each other in the second direction DR2.

The emission areas EMA of the respective sub-pixels SPX included in one pixel PX may be arranged to be spaced from each other along the first direction DR1. Similarly, the cutout areas CBA may be arranged to be spaced from each other along the first direction DR1. The emission areas EMA and the cutout areas CBA may be arranged to be spaced from each other along the first direction DR1, respectively, and may be alternately arranged along the second direction DR2.

The cutout area CBA may be an area in which electrodes 21 and 22 included in the respective sub-pixels SPX adjacent each other in the second direction DR2 are separated from each other. The light-emitting devices ED may not be disposed in the cutout area CBA. In addition, portions of the electrodes 21 and 22 disposed for each sub-pixel SPX may be disposed in the cutout area CBA. The electrodes 21 and 22 disposed for each sub-pixel SPX may be separated from each other in the cutout area CBA.

Referring to FIG. 19, the display apparatus 10 may include a circuit device layer CCL and a light-emitting device layer disposed on the circuit device layer CCL. The circuit device layer CCL may include a substrate 11, and a buffer layer 12, a lower metal layer BML, an active material layer ACT, a plurality of conductive layers, a plurality of insulating films, a via layer 19, and the like, disposed on the substrate 11. The light-emitting device layer may be disposed on the via layer 19 of the circuit device layer CCL, and may include electrodes 21 and 22, an internal bank IBK, light-emitting devices ED, a plurality of insulating layers 51, 52, 53, and 54, an external bank OBK, and the like.

The substrate 11 may be an insulating substrate. The substrate 11 may be made of an insulating material such as glass, quartz, or a polymer resin. In addition, the substrate 11 may be a rigid substrate, but may also be a flexible substrate that may be bent, folded, or rolled.

The lower metal layer BML may be disposed on the substrate 11. The lower metal layer BML may be a light blocking layer serving to protect the active material layer ACT of a semiconductor layer from external light. The lower metal layer BML may include a material blocking light. For example, the lower metal layer BML may be made of an opaque metal material blocking transmission of the light.

The lower metal layer BML has a patterned shape. The lower metal layer BML may be disposed to cover at least a channel region of the active material layer ACT of a transistor TR of the display apparatus 10 in the third direction DR3, and further, may be disposed to cover the entire active material layer ACT of the transistor TR, below the active material layer ACT of the transistor TR. However, the present disclosure is not limited thereto, and the lower metal layer BML may be omitted.

The buffer layer 12 may be disposed on the lower metal layer BML and the substrate 11. The buffer layer 12 may be disposed to cover the entire surface of the substrate 11 on which the lower metal layer BML is disposed. The buffer layer 12 may serve to protect the transistor TR from moisture permeating through the substrate 11 vulnerable to moisture permeation. The buffer layer 12 may include a plurality of inorganic layers that are alternately stacked. For example, the buffer layer 12 may be formed as multiple layers in which inorganic layers including at least one of silicon oxide ($SiO_x$), silicon nitride ($SiN_x$), and silicon oxynitride ($SiO_xN_y$) are alternately stacked.

The semiconductor layer may be disposed on the buffer layer 12. The semiconductor layer may include the active material layer ACT of the transistor TR. The active material layer ACT may be disposed to overlap the lower metal layer BML in the third direction DR3. The active material layer ACT may include doped regions (e.g., doped with conductive dopants) and a undoped region or channel region in-between the doped regions.

The semiconductor layer may include polycrystalline silicon, an oxide semiconductor, or the like. In one or more embodiments, when the semiconductor layer includes the polycrystalline silicon, the semiconductor layer may be formed by crystallizing amorphous silicon. In one or more embodiments, the semiconductor layer may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO), or the like.

A gate insulating film 13 may be disposed on the active material layer ACT and the buffer layer 12. The gate insulating film 13 may be disposed on the buffer layer 12 on which the active material layer ACT is disposed. The gate insulating film 13 may function as a gate insulating film of the transistor TR. The gate insulating film 13 may be formed as an inorganic layer including an inorganic material, for example, silicon oxide ($SiO_x$), silicon nitride ($SiN_x$), or silicon oxynitride ($SiO_xN_y$), or may be formed in a structure in which such inorganic layers are stacked.

A gate conductive layer 14 may be disposed on the gate insulating film 13. The gate conductive layer 14 may include a gate electrode GE of the transistor TR and a first capacitance electrode CSE of a storage capacitor.

The gate electrode GE may be disposed to overlap the channel region (e.g., the undoped region) of the active material layer ACT in the third direction DR3. The first capacitance electrode CSE may be disposed to overlap a second source/drain electrode SD2 of the transistor TR, to be described later, in the third direction DR3. The first capacitance electrode CSE is disposed to overlap the second source/drain electrode SD2 in the third direction DR3, such that a storage capacitor may be formed between the first capacitance electrode CSE and the second source/drain electrode SD2. In one or more embodiments, the first capacitance electrode CSE and the gate electrode GE may be integrated into one layer. A portion of the integrated layer may include the gate electrode GE, and another portion of the integrated layer may include the first capacitance electrode CSE.

The gate conductive layer 14 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the present disclosure is not limited thereto.

An interlayer insulating film 15 is disposed on the gate conductive layer 14 and the gate insulating film 13. The interlayer insulating film 15 may be disposed on the gate insulating film 13 on which the gate conductive layer 14 is formed. The interlayer insulating film 15 may include an inorganic insulating material such as silicon oxide ($SiO_x$), silicon nitride ($SiN_x$), or silicon oxynitride ($SiO_xN_y$).

A first data conductive layer 16 is disposed on the interlayer insulating film 15. The first data conductive layer 16 may include a first source/drain electrode SD1 and a second source/drain electrode SD2 of the transistor TR, and a data line DTL.

The first and second source/drain electrodes SD1 and SD2 may be electrically connected to both end regions of the active material layer ACT (e.g., doped regions of the active material layer ACT) through contact holes penetrating through the interlayer insulating film 15 and the gate insulating film 13, respectively. In addition, the second source/drain electrode SD2 of the transistor TR may be electrically connected to the lower metal layer BML through a contact hole penetrating through the interlayer insulating film 15, the gate insulating film 13, and the buffer layer 12.

The data line DTL may apply a data signal to another transistor included in the display apparatus 10. In one or more embodiments, the data line DTL may be connected to a source/drain electrode of another transistor.

The first data conductive layer 16 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the present disclosure is not limited thereto.

A passivation layer 17 is disposed on the first data conductive layer 16 and the interlayer insulating film 15. The passivation layer 17 serves to cover and protect the first data conductive layer 16. The passivation layer 17 may include an inorganic insulating material such as silicon oxide ($SiO_x$), silicon nitride ($SiN_x$), or silicon oxynitride ($SiO_xN_y$).

A second data conductive layer 13 is disposed on the passivation layer 17. The second data conductive layer 18 may include a first voltage line VL1, a second voltage line VL2, and a first conductive pattern CDP.

A high potential voltage (or a first source voltage) may be supplied to the first voltage line VL1, and a low potential voltage (or a second source voltage) lower than the high potential voltage (e.g., the first source voltage) supplied to the first voltage line VL1 may be supplied to the second voltage line VL2. The second voltage line VL2 may be electrically connected to a second electrode 22 to supply the low potential voltage (e.g., the second source voltage) to the second electrode 22. In addition, an alignment signal necessary for aligning the light-emitting devices ED may be applied to the second voltage line VL2 in manufacturing processes of the display apparatus 10.

The first conductive pattern CDP may be electrically connected to the second source/drain electrode SD2 of the transistor TR through a contact hole penetrating through the passivation layer 17. The first conductive pattern CDP may be electrically connected to a first electrode 21 through a first contact hole CT1 to be described later to transfer the first source voltage applied from the first voltage line VL1 to the first electrode 21.

The second data conductive layer 18 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the present disclosure is not limited thereto.

The via layer 19 is disposed on the second data conductive layer 18 and the passivation layer 17. The via layer 19 may be disposed on the passivation layer 17 on which the second data conductive layer 18 is disposed. The via layer 19 may serve to planarize a surface. The via layer 19 may include an organic insulating material, for example, an organic material such as polyimide (PI).

Hereinafter, a structure of the light-emitting device layer disposed on the via layer 19 will be described in detail with reference to FIG. 19 in conjunction with FIG. 18.

The internal bank IBK may be disposed on the via layer 19. The internal bank IBK may have a shape that extends in the second direction DR2 within each sub-pixel SPX in a plan view. The internal banks IBK may be spaced from each other and terminated at boundaries between sub-pixels SPX adjacent to each other in the second direction DR2 so as not to extend to other sub-pixels SPX neighboring in the second direction DR2.

The internal bank IBK included in each sub-pixel SPX may include a first internal bank IBK1 and a second internal bank IBK2.

The first internal bank IBK1 and the second internal bank IBK2 may be disposed to be spaced from and oppose each other in the first direction DR1 in the emission area EMA. A space formed by disposing the first internal bank IBK1 and the second internal bank IBK2 so as to be spaced from each other may provide an area in which the plurality of light-emitting devices ED are disposed. It has been illustrated in FIG. 18 that each sub-pixel SPX includes two internal banks (e.g., the first internal bank IBK1 and the second internal bank IBK2), but the present disclosure is not limited thereto. The number of internal banks IBK included in each sub-pixel SPX may be larger than that illustrated in FIG. 18 depending on a shape or an arrangement of electrodes 21 and 22 to be described later.

The internal bank IBK: IBK1 and IBK2 may be disposed directly on the via layer 19. The internal bank 11K may have a structure in which at least a portion thereof protrudes from an upper surface of the via layer 19. A protruding portion of the internal bank IBK may have inclined side surfaces. The internal bank IBK may have the inclined side surfaces to serve to change a traveling direction of light emitted from the light-emitting devices ED and traveling toward the side surfaces of the internal bank IBK into an upward direction (e.g., a display direction). That is, the internal bank IBK may provide a space in which the light-emitting devices ED is disposed, and also serve as a reflective partition wall changing the traveling direction of the light emitted from the light-emitting devices ED into the display direction, as described above. It has been illustrated in FIG. 19 that the side surfaces of the internal bank IBK are inclined in a linear shape, but the present disclosure is not limited thereto. For example, the side surfaces (or outer surfaces) of the internal bank IBK may have a curved semi-circular or semi-elliptical shape. In one or more embodiments, the internal bank 18K may include an organic insulating material such as polyimide (PI), but is not limited thereto.

The electrodes 21 and 22 may be disposed on the internal bank IBK and the via layer 19 exposed by the internal bank IBK. The electrodes 21 and 22 may include a first electrode 21 and a second electrode 22.

Each of the first electrode 21 and the second electrode 22 may have a shape in which it extends in the second direction DR2 in a plan view. The first electrode 21 and the second electrode 22 may be disposed to be spaced from and face each other in the first direction DR1. Shapes of the first electrode 21 and the second electrode 22 in a plan view may be substantially similar to shapes of the first internal bank IBK1 and the second internal bank IBK2 in a plan view, respectively, but areas of the first electrode 21 and the second electrode 22 may be greater than areas of the first internal bank IBK1 and the second internal bank IBK2, respectively.

The first electrode 21 may extend in the second direction DR2 in a plan view so as to overlap a partial area of the external bank OBK extending in the first direction DR1. The first electrode 21 may be in contact with the first conductive pattern CDP through the first contact hole CT1 penetrating through the via layer 19. The first electrode 21 may be electrically connected to the transistor TR through the first conductive pattern CDP.

The second electrode 22 may extend in the second direction DR2 in a plan view so as to overlap a partial area of the external bank OBK extending in the first direction DR1. The second electrode 22 may be in contact with the second voltage line VL2 through a second contact hole CT2 penetrating through the via layer 19.

It has been illustrated in FIGS. 18 and 19 that the first contact hole CT1 and the second contact hole CT2 are disposed to overlap the external bank OBK, but the present disclosure is not limited thereto. For example, the first contact hole CT1 and the second contact hole CT2 may not overlap the external bank OBK, and may be disposed in the emission area EMA surrounded by the external bank OBK.

The cutout area CBA may be positioned between the emission areas EMA of the sub-pixels SPX neighboring to each other in the second direction DR2. The first electrode 21 and the second electrode 22 may be separated from the other electrodes 21 and 22 included in a sub-pixel SPX neighboring in the second direction DR2 in the cutout area CBA in the sub-pixel SPX, respectively. Such shapes of the first electrode 21 and the second electrode 22 may be formed through a process of disconnecting the respective electrodes 21 and 22 from each other in the cutout area CBA after a process of disposing the light-emitting devices ED among the manufacturing processes of the display apparatus 10. However, the present disclosure is not limited thereto, and some electrodes 21 and 22 may be disposed to extend to the sub-pixel SPX neighboring in the second direction DR2 to be integrated with the other electrodes 21 and 22 or only one of the first electrode 21 and the second electrode 22 may be separated.

Shapes and arrangements of the first electrode 21 and the second electrode 22 disposed for each sub-pixel SPX are not particularly limited as long as at least partial areas of the first electrode 21 and the second electrode 22 are disposed to be spaced from and oppose each other to form a space in which the light-emitting devices ED are to be disposed. It has been illustrated in FIGS. 18 and 19 that one first electrode 21 and one second electrode 22 are disposed for each sub-pixel SPX, but the present disclosure is not limited thereto, and the numbers of first electrodes 21 and second electrodes 22 disposed for each sub-pixel SPX may be more than one. In addition, the first electrode 21 and the second electrode 22 disposed in each sub-pixel SPX are not limited to having the shape in which they extends in one direction in a plan view, may have a shape in which they are partially curved or bent, and any one electrode may be disposed to be around (e.g., to surround) the other electrode.

The first electrode 21 may be disposed on the first internal bank IBK1 to cover an outer surface of the first internal bank IBK1. The first electrode 21 may extend outward from side surfaces of the first internal bank IBK1 to be partially disposed on the upper surface of the via layer 19 exposed by the first internal bank IBK1 and the second internal bank IBK2.

The second electrode 22 may be disposed on the second internal bank IBK2 to cover an outer surface of the second internal bank IBK2. The second electrode 22 may extend outward from side surfaces of the second internal bank IBK2 to be partially disposed on the upper surface of the via layer 19 exposed by the first internal bank IBK1 and the second internal bank IBK2. The first electrode 21 and the second electrode 22 may be disposed to be spaced from each other in the first direction DR1 to expose at least a portion of the via layer 19 in an area between the first internal bank IBK1 and the second internal bank IBK2.

The first and second electrodes 21 and 22 may be electrically connected to the light-emitting devices ED, respectively, and a suitable voltage (e.g., a predetermined voltage) may be applied to the first and second electrodes 21 and 22 so that the light-emitting devices ED emit light. For example, the first and second electrodes 21 and 22 may be electrically connected to the light-emitting devices ED disposed between the first and second electrodes 21 and 22 through first and second contact electrodes 41 and 42 to be described later, and electrical signals applied to the first and second electrodes 21 and 22 may be transferred to the light-emitting devices ED through the first and second contact electrodes 41 and 42.

In one or more embodiments, any one of the first electrode 21 and the second electrode 22 may be electrically connected to anode electrodes of the light-emitting devices ED, and the other one of the first electrode 21 and the second electrode 22 may be electrically connected to cathode electrodes of the light-emitting devices ED. However, the first electrode 21 and the second electrode 22 are not limited thereto, and vice versa.

Each of the electrodes 21 and 22 may be utilized to form an electric field in the sub-pixel SPX to align the light-emitting devices ED. The light-emitting devices ED may be disposed between the first electrode 21 and the second electrode 22 by an electric field formed between the first electrode 21 and the second electrode 22. In one or more embodiments, the light-emitting devices ED of the display apparatus 10 may be jetted onto the electrodes 21 and 22 through an inkjet printing process. When ink including the light-emitting devices ED is jetted onto the electrodes 21 and 22, an alignment signal is applied to the electrodes 21 and 22 to generate an electric field. The light-emitting devices ED dispersed in the ink may be aligned on the electrodes 21 and 22 by receiving a dielectrophoretic force by the electric field generated on the electrodes 21 and 22.

Each of the electrodes 21 and 22 may include a transparent conductive material. As an example, each of the electrodes 21 and 22 may include a material such as indium tin oxide (ITO), indium zinc oxide (IZO), or indium tin zinc oxide (ITZO), but is not limited thereto. In one or more embodiments, each of the electrodes 21 and 22 may include a conductive material having high reflectivity. For example, each of the electrodes 21 and 22 may include a metal such as silver (Ag), copper (Cu), or aluminum (Al) as the material having the high reflectivity. In this case, each of the electrodes 21 and 22 may reflect the light emitted from the light-emitting devices ED and traveling toward the side surfaces of each internal bank IBK: IBK1 and IBK2 so that the light travels in the display direction of each sub-pixel SPX. The present disclosure is not limited thereto, and each of the electrodes 21 and 22 may have a structure in which one or more layers made of the transparent conductive material and one or more layers made of the metal having the high reflectivity are stacked or may be formed as one layer including the transparent conductive material and the metal having the high reflectivity. In one or more embodiments, each of the electrodes 21 and 22 may have a stacked structure of ITO/silver (Ag)/ITO/, ITO/Ag/IZO, or ITO/Ag/ITZO/IZO or be made of an alloy including aluminum (Al), nickel (Ni), lanthanum (La), and the like.

A first insulating layer 51 may be disposed on the first and second electrodes 21 and 22. The first insulating layer 51 is disposed on the via layer 19 and the first and second electrodes 21 and 22, but is disposed to expose at least portions of the first and second electrodes 21 and 22. The first insulating layer 51 may be completely formed on the via layer 19 as well as an area between the first electrode 21 and the second electrode 22, but may be disposed to expose portions of the first electrode 21 and the second electrode 22 overlapping the first internal bank IBK1 and the second internal bank IBK2.

The first insulating layer 51 may have a step formed so that a portion of an upper surface thereof is recessed between the first electrode 21 and the second electrode 22. The first insulating layer 51 may be formed so that a portion of the upper surface thereof is recessed due to a step formed by members (e.g., the first electrode 21 and/or the second electrode 22) disposed therebelow. In one or more embodiments, the step is formed between the first electrode 21 and the second electrode 22, such that an empty space maybe formed between the upper surface of the first insulating layer 51 of which a portion is recessed and the light-emitting devices ED. The empty space between the first insulating layer 51 and the light-emitting devices ED may be filled with a material constituting a second insulating layer 52 to be described later. However, the present disclosure is not limited thereto, and the step may not be formed in the first insulating layer 51 between the first electrode 21 and the second electrode 22. For example, the first insulating layer 51 may include a flat upper surface so that the light-emitting devices ED are disposed between the first electrode 21 and the second electrode 22.

The first insulating layer 51 may insulate the first electrode 21 and the second electrode 22 from each other while protecting the first electrode 210 and the second electrode 220. In addition, the first insulating layer 51 may prevent the light-emitting devices ED disposed on the first insulating layer 510 from being in direct contact with and damaged by other members.

The external bank OBK may be disposed on the first insulating layer 51. The external bank OBK may be disposed in a lattice-shaped pattern in the entirety of the display area DA by including portions extending in the first direction DR1 and the second direction DR2 in a plan view. The external bank OBK may be disposed across boundaries between the respective sub-pixels SPX to divide neighboring sub-pixels SPX.

According to one or more embodiments, the external bank OBK may be formed to have a height greater than that of the internal bank IBK. The external bank OBK may perform a function of preventing ink from overflowing into adjacent sub-pixels SPX in the inkjet printing process of the manufacturing processes of the display apparatus 10. The external bank OBK may separate inks in which different light-emitting devices ED are dispersed for each of the different sub-pixels SPX from each other so that these inks are not mixed with each other.

The external bank OBK may be disposed to be around (e.g., to surround) the emission area EMA and the cutout area CBA disposed for each sub-pixel SPX to divide the emission area EMA and the cutout area CBA. The first electrode 21 and the second electrode 22 may be disposed to extend in the second direction DR2 to cross a portion of the external bank OBK extending in the first direction DR1. The respective electrodes 21 and 22 may overlap the external bank OBK disposed between the cutout area CBA and the emission area EMA, and the first and second contact holes CT1 and CT2 may be formed in portions where the respective electrodes 21 and 22 overlap the external bank OBK.

The external bank OBK may include polyimide (PI) like the internal bank IBK, but is not limited thereto.

The light-emitting devices ED may be disposed on the first insulating layer 51 between the respective electrodes 21 and 22. The light-emitting device ED may have a shape in which it extends in one direction. The plurality of light-emitting devices ED may be disposed to be spaced from each other along the second direction DR2 in which the respective electrodes 21 and 22 extend and may be aligned to be substantially parallel to each other, in a plan view. An interval between the light-emitting devices ED that are spaced from each other is not particularly limited. In addition, the light-emitting devices ED may have a shape in which they extend in one direction, and a direction in which the respective electrodes 21 and 22 extend and a direction in which the light-emitting devices ED extend may be substantially perpendicular to each other. However, the present disclosure is not limited thereto, and the light-emitting devices ED are not perpendicular to the direction in which the respective electrodes 21 and 22 extend, and may also be disposed to be oblique with respect to the direction in which the respective electrodes 21 and 22 extend.

As described above, the light-emitting device ED may include the active layer 330 to emit light of a specific wavelength band to the outside. The display apparatus 10 may include the light-emitting devices ED emitting light of different wavelength bands. Accordingly, light of a first color, light of a second color, and light of a third color may be emitted from the first sub-pixel SPX1, the second sub-pixel SPX2, and the third sub-pixel SPX3, respectively. However, the present disclosure is not limited thereto, and the light-emitting devices ED disposed in each sub-pixel SPX may also include active layers 330 including the same material to emit light of substantially the same color.

A second insulating layer 52 may be partially disposed on the light-emitting device ED disposed between the first electrode 21 and the second electrode 22. The second insulating layer 52 may be disposed to partially surround an outer surface (e.g., an outer peripheral or circumferential surface) of the light-emitting device ED. The second insulating layer 52 may be disposed on the light-emitting device ED, but may expose one end and the other end of the light-emitting device ED.

A portion of the second insulating layer 52 disposed on the light-emitting device ED may have a shape in which it extends in the second direction DR2 between the first electrode 21 and the second electrode 22, in a plan view. As an example, the second insulating layer 52 may form a linear or island-shaped pattern within each sub-pixel SPX. In one or more embodiments, as described above, the material constituting the second insulating layer 52 may be disposed between the first electrode 21 and the second electrode 22, and may be filled in the empty space between the first insulating layer 51 formed to be recessed and the light-emitting devices ED.

The second insulating layer 52 may serve to fix the light-emitting devices ED in the manufacturing processes of the display apparatus 10 while protecting the light-emitting devices ED.

The contact electrodes 41 and 42 may be disposed on the second insulating layer 52. The contact electrodes 41 and 42 may include a first contact electrode 41 and a second contact electrode 42.

The first and second contact electrodes 41 and 42 may have a shape in which they extend in one direction in a plan view. Each of the first contact electrode 41 and the second contact electrode 42 may have a shape in which it extends in the second direction DR2. The first contact electrode 41 and the second contact electrode 42 may be disposed to be spaced from and oppose each other in the first direction DR1. The first contact electrode 41 and the second contact electrode 42 may form a stripe pattern in the emission area EMA of each sub-pixel SPX.

The first contact electrode 41 may be disposed on the first electrode 21. The first contact electrode 41 may be in contact with the first electrode 21 exposed by the first insulating layer 51. The first contact electrode 41 may be in contact with one ends of the light-emitting devices ED. The first contact electrode 41 may be in contact with one ends of the light-emitting devices ED and the first electrode 21 to serve to electrically connect the light-emitting devices ED and the first electrode 21 to each other. The first contact electrode 41 may extend from one end of the light-emitting device ED toward the second insulating layer 52 to be also disposed on a partial area of the second insulating layer 52.

One end of the light-emitting device ED exposed by the second insulating layer 52 may be electrically connected to the first electrode 21 through the first contact electrode 41, and the other end of the light-emitting device ED exposed by the second insulating layer 520 may be electrically connected to the second electrode 22 through the second contact electrode 42.

A third insulating layer 53 is disposed on the first contact electrode 41. The third insulating layer 53 may electrically insulate the first contact electrode 41 and the second contact electrode 42 from each other. The third insulating layer 53 may be disposed to cover the first contact electrode 41, but may not be disposed on the other end of the light-emitting device ED so that light-emitting device ED may be in contact with the second contact electrode 42.

The second contact electrode 42 may be disposed on the second electrode 22. The second contact electrode 42 may be in contact with the second electrode 22 exposed by the first insulating layer 51. The second contact electrode 42 may be in contact with the other ends of the light-emitting devices ED. The second contact electrode 42 may be in contact with the other ends of the light-emitting devices ED and the second electrode 22 to serve to electrically connect the light-emitting devices ED and the second electrode 22 to each other. The second contact electrode 42 may extend from the other end of the light-emitting device ED toward the second insulating layer 52 and the third insulating layer 53 to be also disposed on partial areas of the second insulating layer 52 and the third insulating layer 53.

The first and second contact electrodes 41 and 42 may include a conductive material. For example, the first and second contact electrodes 41 and 42 may include ITO, IZO, ITZO, aluminum (Al), or the like. As an example, the contact electrodes 41 and 42 may include a transparent conductive material, but are not limited thereto.

A fourth insulating layer 54 may be entirely disposed on the substrate 11. The fourth insulating layer 54 may serve to protect members disposed on the substrate 11 from an external environment.

Each of the first insulating layer 51, the second insulating layer 52, the third insulating layer 53, and the fourth insulating layer 54 described above may include an inorganic insulating material or an organic insulating material. In one or more embodiments, the first insulating layer 51, the second insulating layer 52, the third insulating layer 53, and the fourth insulating layer 54 may include an inorganic insulating material such as silicon oxide ($SiO_x$), silicon nitride ($SiN_x$), silicon oxynitride ($SiO_xN_y$), aluminum oxide ($AlO_x$), or aluminum nitride (AlN). Alternatively, the first insulating layer 51, the second insulating layer 52, the third insulating layer 53, and the fourth insulating layer 54 may include an organic insulating material such as an acrylic resin, an epoxy resin, a phenolic resin, a polyamide resin, a polyimide resin, an unsaturated polyester resin, a polyphenylene resin, a polyphenylene sulfide resin, a benzocyclobutene, a cardo resin, a siloxane resin, a silsesquioxane resin, polymethyl methacrylate, polycarbonate, or polymethyl methacrylate-polycarbonate synthetic resin. However, the present disclosure is not limited thereto.

Figure 20:
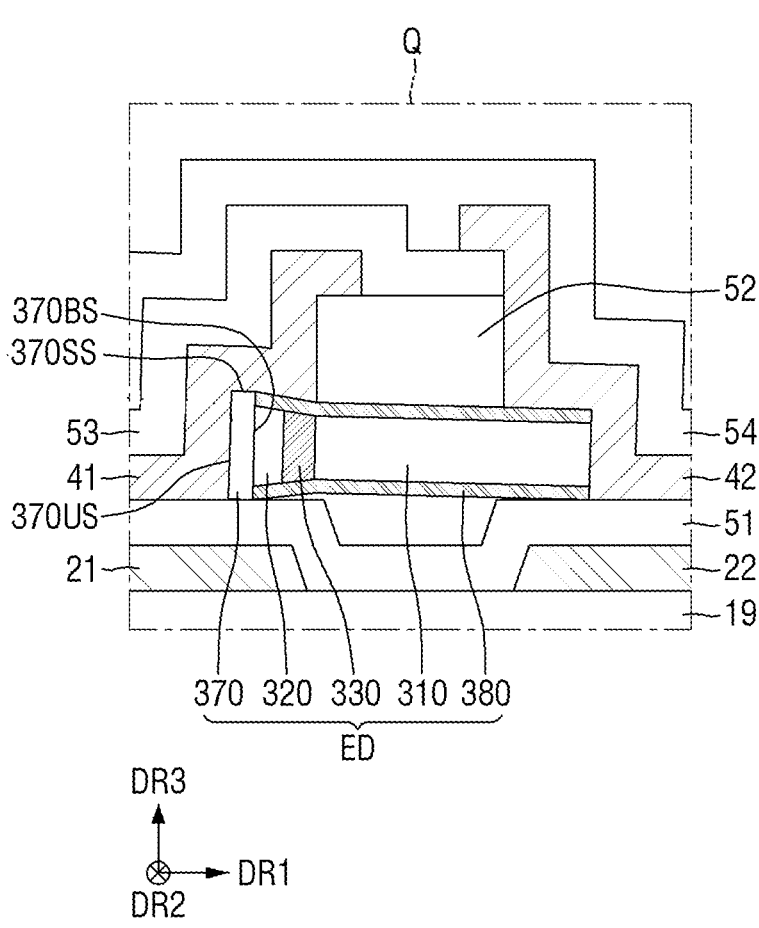
FIG. 20 is an enlarged view illustrating an example of a portion Q of FIG. 19.

FIG. 20 is an enlarged view illustrating an example of a portion Q of FIG. 19.

Hereinafter, an arrangement relationship between the first insulating layer 51, the first contact electrode 41, the second contact electrode 42, and the light-emitting device ED will be described in detail with reference to FIG. 20.

Referring to FIG. 20 in conjunction with FIGS. 2 and 19, the light-emitting device ED may have one end and the other end. One end of the light-emitting device ED may be an end on a side where the second semiconductor layer 320 is positioned, and the other end of the light-emitting device ED may be an end on a side where the first semiconductor layer 310 is positioned.

The second insulating layer 52 may be disposed on the insulating film 380 of the light-emitting device ED. The first contact electrode 41 and the second contact electrode 42 may be in contact with one end and the other end of the light-emitting device ED exposed by the second insulating layer 52, respectively.

One end of the light-emitting device ED may be in contact with the first contact electrode 41. One end of the light-emitting device ED may be in contact with the first contact electrode 41 to be electrically connected to the first electrode 21. The other end of the light-emitting device ED may be in contact with the second contact electrode 42. The other end of the light-emitting device ED may come into contact with the second contact electrode 42 to be electrically connected to the second electrode 22.

The first contact electrode 41 may be in contact with the electrode layer 370 and the insulating film 380 of the light-emitting device ED. Specifically, the first contact electrode 41 may be in contact with the upper surface 370US and the side surface 370SS of the electrode layer 370. The first contact electrode 41 may be in contact with a portion of the insulating film 380 around (e.g., surrounding) the second semiconductor layer 320 and the active layer 330. In one or more embodiments, the first contact electrode 41 may not be in contact with the second semiconductor layer 320 and the active layer 330.

The second contact electrode 42 may be in contact with the first semiconductor layer 310 and the insulating film 380 of the light-emitting device ED. Specifically, the second contact electrode 42 may be in contact with the lower surface of the first semiconductor layer 310. The second contact electrode 42 may be in contact with a portion of the insulating film 380 around (e.g., surrounding) the first semiconductor layer 310.

In one or more embodiments, a contact area between one end of the light-emitting device ED and the first contact electrode 41 may be different from a contact area between the other end of the light-emitting device ED and the second contact electrode 42. For example, a contact area between one end of the light-emitting device ED on a side where the electrode layer 370 is disposed and the first contact electrode 41 may be greater than a contact area between the other end of the light-emitting device ED on the side where the first semiconductor layer 310 is disposed and the second contact electrode 42.

In the display apparatus 10 including the light-emitting devices ED according to the embodiment of FIG. 20, the insulating film 380 of the light-emitting device ED exposes at least a portion of the side surface 370SS of the electrode layer 370, and accordingly, the first contact electrode 41 is in contact with not only the upper surface 370US of the electrode layer 370 but also the side surface 370SS of the electrode layer 370, such that a contact area of the electrode layer 370 in contact with the first contact electrode 41 may increase. In addition, the electrode layer 370 of the light-emitting device ED is formed to have the diameter greater than the diameter of the light-emitting device core 300, such that a contact area of the electrode layer 370 in contact with the first contact electrode 41 may increase. Accordingly, the contact areas between the light-emitting device ED and the contact electrodes 41 and 42 increase, such that contact defect rates between the light-emitting device ED and the contact electrodes 41 and 42 may decrease.

Figure 21:
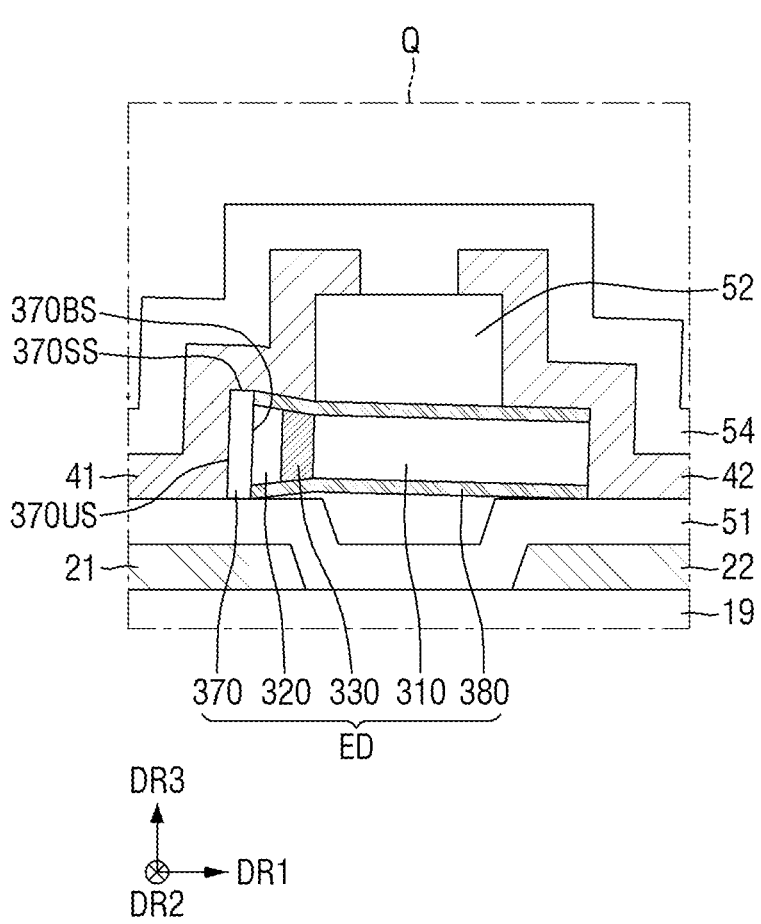
FIG. 21 is an enlarged view illustrating another example of the portion Q of FIG. 19.

FIG. 21 is an enlarged view illustrating an example of the portion Q of FIG. 19.

Referring to FIG. 21, the embodiment is different from the embodiment of FIG. 20 in that the third insulating layer 53 is omitted.

Specifically, the first contact electrode 41 and the second contact electrode 42 may be directly disposed on the second insulating layer 52. The first contact electrode 41 and the second contact electrode 42 may be spaced from each other on the second insulating layer 52 to expose a portion of the second insulating layer 52. The second insulating layer 52 exposed by the first contact electrode 41 and the second contact electrode 42 may be in contact with the fourth insulating layer 54 in the exposed area.

In the embodiment of FIG. 21, in the display apparatus 10, even though the third insulating layer 53 is omitted, the second insulating layer 52 may include an organic insulating material to perform a function of fixing the light-emitting device ED. In addition, the first contact electrode 41 and the second contact electrode 42 may be patterned and concurrently (e.g., simultaneously) formed by a single mask process. Accordingly, an additional mask process for forming the first contact electrode 41 and the second contact electrode 42 is not required, and thus, process efficiency of the display apparatus 10 may be improved. The embodiment of FIG. 21 is the same as the embodiment of FIG. 20 except that the third insulating layer 53 is omitted, and an overlapping description will thus be omitted.

Figure 22:
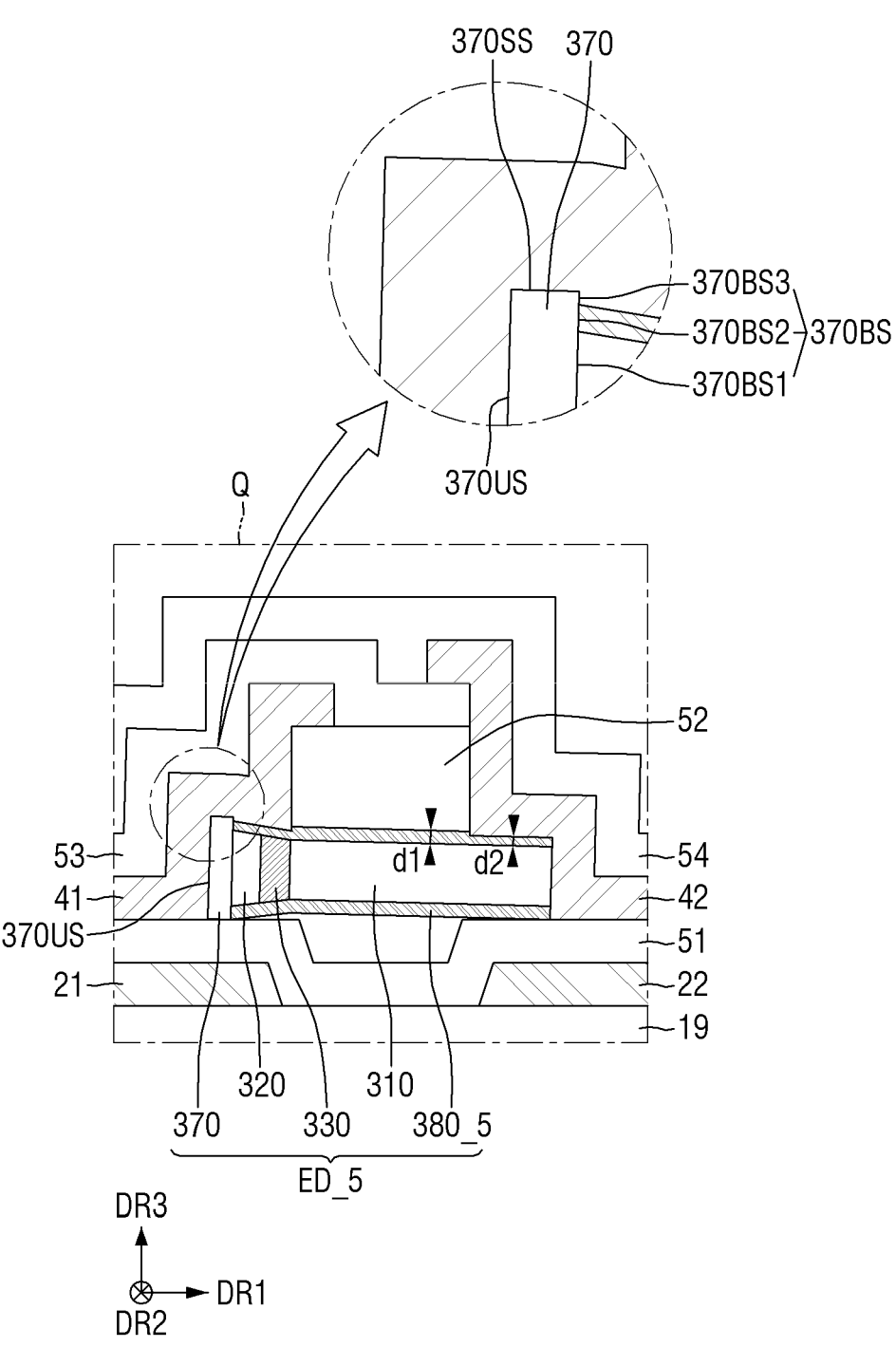
FIG. 22 is an enlarged view illustrating still another example of the portion Q of FIG. 19.

FIG. 22 is an enlarged view illustrating an example of the portion Q of FIG. 19.

FIG. 22 illustrates that a portion of an insulating film 380_5 of a light-emitting device ED_5 is etched in the light-emitting device ED_5 included in the display apparatus 10.

Referring to FIG. 22, in a process of forming the second insulating layer 52 and/or the third insulating layer 53 among the manufacturing processes of the display apparatus 10, a portion of the insulating film 380_5 of the light-emitting device ED_5 may also be partially etched. Accordingly, the insulating film 380_5 may have different thicknesses depending on a relative arrangement of members disposed adjacent thereto.

A thickness d1 of the insulating film 380_5 that overlaps the second insulating layer 52 may be greater than a thickness d2 of the insulating film 380_5 that does not overlap the second insulating layer 52. Because the insulating film 380_5 overlapping the second insulating layer 52 is not etched in the manufacturing processes, the thickness d1 of the insulating film 380_5 that overlaps the second insulating layer 52 may be greater than the thickness d2 of the insulating film 380_5 that does not overlap the second insulating layer 52.

In one or more embodiments, a portion of the insulating film 380_5 is etched, and accordingly, the second region 370BS2 of the electrode layer 370 may further include a third region 370BS3 that is not in contact with the insulating film 380_5. The third region 370BS3 of the electrode layer 370 is not formed in the manufacturing processes of the light-emitting device ED_5, but may be formed by etching a portion of the insulating film 380_5 in a process of forming the second insulating layer 52 and/or the third insulating layer 53 from among the manufacturing processes of the display apparatus 10. Specifically, a portion of the insulating film 380_5 disposed on the second region 370BS2 is etched in the process of forming the second insulating layer 52 and/or the third insulating layer 53 to expose a portion of the lower surface 370BS of the electrode layer 370, such that the third region 370BS3 may be formed. Accordingly, in the embodiment of FIG. 22, the first contact electrode 41 may be disposed on the upper surface 370US, a portion of the side surface 370SS, and the third region 370BS3 of the electrode layer 370. Specifically, the first contact electrode 41 may be in contact with the upper surface 370US, a portion of the side surface 370SS, and the third region 370BS3 of the electrode layer 370.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

The invention claimed is:

1. A light-emitting device comprising:
   a light-emitting device core comprising a first semiconductor layer, a second semiconductor layer on the first semiconductor layer, and an active layer between the first semiconductor layer and the second semiconductor layer;
   an electrode layer on the second semiconductor layer of the light-emitting device core; and
   an insulating film around a side surface of the light-emitting device core,
   wherein a side surface of the electrode layer protrudes outwardly from a side surface of the second semiconductor layer, and
   wherein a minimum diameter of the second semiconductor layer is greater than a maximum diameter of the first semiconductor layer.

2. The light-emitting device of claim 1, wherein one surface of the electrode layer toward the second semiconductor layer comprises a first region overlapping the second semiconductor layer and a second region that does not overlap the second semiconductor layer, and
   wherein the insulating film is on the second region.

3. The light-emitting device of claim 2, wherein the insulating film exposes at least a portion of the side surface of the electrode layer.

4. The light-emitting device of claim 3, wherein the insulating film is not on the side surface of the electrode layer.

5. The light-emitting device of claim 4, wherein a diameter of an outer surface of the insulating film on the one surface of the electrode layer is same as a diameter of the one surface of the electrode layer.

6. The light-emitting device of claim 2, wherein the second region is around the first region.

7. The light-emitting device of claim 6, wherein an area of the first region is greater than an area of the second region.

8. The light-emitting device of claim 2, wherein an outer surface of the insulating film in a region adjacent to the second region is aligned with the side surface of the electrode layer.

9. The light-emitting device of claim 1, wherein a diameter of the second semiconductor layer decreases from the electrode layer toward the active layer.

10. The light-emitting device of claim 9, wherein a diameter of the active layer decreases from the second semiconductor layer toward the first semiconductor layer.

11. The light-emitting device of claim 10, wherein the maximum diameter of the first semiconductor layer is smaller or equal to a minimum diameter of the active layer.

12. The light-emitting device of claim 3, wherein a first thickness of the insulating film on the second region is different from a second thickness of the insulating film on the side surface of the electrode layer.

13. The light-emitting device of claim 12, wherein the first thickness is greater than the second thickness.

14. The light-emitting device of claim 1, wherein the insulating film has a thickness in a range of 20 nm to 100 nm, and wherein a protrusion length of the side surface of the electrode layer protruding from the second semiconductor layer in a thickness direction of the insulating film is in a range of about 20 nm to about 120 nm.

15. A manufacturing method for a light-emitting device, the method comprising:

forming a light-emitting device core and an electrode layer on a substrate, the electrode layer being on the light-emitting device core; and forming an insulating film around a side surface of the light-emitting device core, wherein the forming of the light-emitting device core and the electrode layer comprises forming the electrode layer having a side surface that protrudes outwardly from the side surface of the light-emitting device core, wherein the light-emitting device core comprises:

a first semiconductor layer on the substrate;

a second semiconductor layer between the first semiconductor layer and the electrode layer; and an active layer between the first semiconductor layer and the second semiconductor layer, wherein one surface of the electrode layer adjacent the second semiconductor layer includes a first region overlapping the second semiconductor layer and a second region that does not overlap the second semiconductor layer, wherein the insulating film is on the second region, and wherein a minimum diameter of the second semiconductor layer is greater than a maximum diameter of the first semiconductor layer.

16. The manufacturing method for the light-emitting device of claim 15, wherein the insulating film exposes at least a portion of the side surface of the electrode layer.

17. The manufacturing method for the light-emitting device of claim 15, wherein the forming of the insulating film comprises:

forming an insulating coating covering outer surfaces of the light-emitting device core and the electrode layer; and exposing another surface of the electrode layer opposite to the one surface of the electrode layer and at least a portion of the side surface of the electrode layer by removing a portion of the insulating coating.

18. The manufacturing method for the light-emitting device of claim 16, wherein a diameter of the second semiconductor layer decreases from the electrode layer toward the active layer, and wherein a diameter of the active layer decreases from the second semiconductor layer toward the first semiconductor layer.

19. A display apparatus comprising:

a substrate;

a first electrode on the substrate;

a second electrode on the substrate and spaced from the first electrode; and a light-emitting device between the first electrode and the second electrode and electrically connected to the first electrode and the second electrode, wherein the light-emitting device comprises:

a light-emitting device core comprising a first semiconductor layer, a second semiconductor layer on the first semiconductor layer, and an active layer between the first semiconductor layer and the second semiconductor layer;

an electrode layer on the second semiconductor layer of the light-emitting device core; and an insulating film around a side surface of the light-emitting device core, wherein a side surface of the electrode layer protrudes outwardly from a side surface of the second semiconductor layer, and wherein a minimum diameter of the second semiconductor layer is greater than a maximum diameter of the first semiconductor layer.

20. The display apparatus of claim 19, wherein one surface of the electrode layer toward the second semiconductor layer has a first region overlapping the second semiconductor layer and a second region that does not overlap the second semiconductor layer, and wherein the insulating film is on the second region.

21. The display apparatus of claim 20, wherein the insulating film exposes at least a portion of the side surface of the electrode layer.

22. The display apparatus of claim 20, further comprising:

a first contact electrode on the first electrode and one end of the light-emitting device; and a second contact electrode on the second electrode and another end of the light-emitting device, wherein the first contact electrode and the second contact electrode are electrically insulated from each other.

23. The display apparatus of claim 22, wherein the first contact electrode is on another surface of the electrode layer opposite to the one surface of the electrode layer and a portion of the side surface of the electrode layer.

24. The display apparatus of claim 23, wherein the second region includes a third region that does not overlap the insulating film, and wherein the first contact electrode is further on the third region.

* * * * *